United States Patent
Kai et al.

(10) Patent No.: US 10,700,166 B2
(45) Date of Patent: Jun. 30, 2020

(54) NOZZLE CLEANING DEVICE, NOZZLE CLEANING METHOD, AND SUBSTRATE PROCESSING APPARATUS

(71) Applicant: Tokyo Electron Limited, Tokyo (JP)

(72) Inventors: Yoshihiro Kai, Koshi (JP); Shinya Ishikawa, Koshi (JP); Yuji Kamikawa, Koshi (JP); Shuichi Nagamine, Koshi (JP); Naoki Shindo, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 1238 days.

(21) Appl. No.: 13/904,315

(22) Filed: May 29, 2013

(65) Prior Publication Data

US 2013/0319470 A1 Dec. 5, 2013

(30) Foreign Application Priority Data

May 31, 2012 (JP) .................................. 2012-125173

(51) Int. Cl.
  B08B 9/032 (2006.01)
  H01L 29/16 (2006.01)
  (Continued)

(52) U.S. Cl.
  CPC ........ H01L 29/1608 (2013.01); B05B 15/555 (2018.02); B05B 15/557 (2018.02);
  (Continued)

(58) Field of Classification Search
  CPC ... B05B 15/02; B05B 15/025; B05B 15/0258; B05B 15/0266; B05B 15/50;
  (Continued)

(56) References Cited

U.S. PATENT DOCUMENTS 5,565,034 A * 10/1996 Nanbu ............. H01L 21/67173
  118/319
5,958,517 A * 9/1999 Poag .................... B05B 15/025
  118/302

(Continued)

FOREIGN PATENT DOCUMENTS

JP 05-166715 A 7/1993
JP H08-192083 A 7/1996
  (Continued)

OTHER PUBLICATIONS

KR20070036865—Machine Translation, Apr. 2007.*
  (Continued)

*Primary Examiner* — Marc Lorenzi
(74) *Attorney, Agent, or Firm* — Pearne & Gordon LLP

(57) ABSTRACT

A nozzle cleaning device is capable of uniformly cleaning a nozzle from a front end of the nozzle to an upper part thereof. The nozzle cleaning device includes a storage tank, a liquid discharging portion and an overflow discharging portion. The storage tank has a cylindrical inner peripheral surface and is configured to store therein a cleaning liquid that cleans a nozzle used in a substrate process. The liquid discharging portion is configured to discharge the cleaning liquid into the storage tank toward a position eccentric with respect to a central axis of the cylindrical inner peripheral surface to store the cleaning liquid within the storage tank and configured to form a vortex flow of the cleaning liquid revolving within the storage tank. The overflow discharging portion is configured to discharge the cleaning liquid that overflows the storage tank.

10 Claims, 17 Drawing Sheets

(51) Int. Cl.
*B05B 15/55* (2018.01)
*B05B 15/555* (2018.01)
*B08B 3/10* (2006.01)
*H01L 21/67* (2006.01)
*H01L 29/78* (2006.01)
*B05B 1/36* (2006.01)

(52) U.S. Cl.
CPC ............ *B08B 3/102* (2013.01); *B08B 9/0321* (2013.01); *B08B 9/0328* (2013.01); *H01L 21/67051* (2013.01); *H01L 29/7813* (2013.01); *B05B 1/36* (2013.01)

(58) Field of Classification Search
CPC ..... B05B 15/55; B05B 15/555; B05B 15/557; B08B 9/023; B08B 9/0321; B08B 9/0328
See application file for complete search history.

(56) References Cited

U.S. PATENT DOCUMENTS

| | | | | |
|---|---|---|---|---|
| 2008/0023034 | A1* | 1/2008 | Hirao | B05B 15/025 134/11 |
| 2010/0051059 | A1* | 3/2010 | Kometani | B08B 9/00 134/21 |
| 2010/0310757 | A1* | 12/2010 | Ooshiro | B05C 5/0291 427/8 |

FOREIGN PATENT DOCUMENTS

| | | | |
|---|---|---|---|
| JP | H10-258249 A | | 9/1998 |
| JP | 2000-167469 A | | 6/2000 |
| JP | 2006-263535 A | | 10/2006 |
| JP | 2007-258462 A | | 4/2007 |
| JP | 2007-258462 A | | 10/2007 |
| JP | 2007-317706 A | | 12/2007 |
| JP | 2010-062352 A | | 3/2010 |
| KR | 20070036865 A | * | 4/2007 |
| KR | 100895030 B1 | * | 4/2009 |
| KR | 20110058286 A | * | 6/2011 |

OTHER PUBLICATIONS

KR100895030—Machine Translation, Apr. 2009.*
JP2006263535—Machine Translation (Year: 2006).*
KR20110058286—Machine Translation (Year: 2011).*

* cited by examiner

NOZZLE CLEANING DEVICE, NOZZLE CLEANING METHOD, AND SUBSTRATE PROCESSING APPARATUS

CROSS-REFERENCE TO RELATED APPLICATION

This application claims the benefit of Japanese Patent Application No. 2012-125273 filed on May 31, 2012, the entire disclosures of which are incorporated herein by reference.

FIELD OF THE INVENTION

The present disclosure relates to a nozzle cleaning device, a nozzle cleaning method, and a substrate processing apparatus.

BACKGROUND OF THE INVENTION

Conventionally, there has been known a substrate processing apparatus that processes a substrate, such as a semiconductor wafer or a glass substrate, by supplying a processing liquid through a nozzle.

The processing liquid may adhere to the nozzle and may remain at the nozzle as a cohesive material. If a substrate process is performed while such a cohesive material adheres to the nozzle, the cohesive material adhering to the nozzle may be scattered on the substrate, so that the substrate is damaged. Therefore, such a substrate processing apparatus may include a nozzle cleaning device configured to clean the nozzle with a cleaning liquid to remove the cohesive material adhering to the nozzle.

By way of example, Patent Document 1 describes a nozzle cleaning device configured to inject a cleaning liquid to a nozzle from one side of the nozzle to remove a cohesive material adhering to the nozzle.

Further, Patent Document 2 describes a nozzle cleaning device that includes a cleaning chamber configured to accommodate a nozzle and is configured to supply a cleaning liquid along an inner peripheral surface of the cleaning chamber and form a vortex-shaped flow of the cleaning liquid around a front end of the nozzle to clean the front end of the nozzle.

Patent Document 1: Japanese Patent Laid-open Publication No. 2007-258462

Patent Document 2: Japanese Patent Laid-open Publication No. 2007-317706

However, if the cleaning liquid is injected as described in Patent Document 1, the nozzle may not be cleaned uniformly. In particular, if the cleaning liquid is injected from one side of the nozzle as described in Patent Document 1, the other side of the nozzle cannot be cleaned sufficiently.

Further, in accordance with the method as described in Patent Document 2, an upper part of the nozzle may not be cleaned. This is because if the upper part of the nozzle is cleaned by the cleaning liquid stored in the cleaning chamber, the cleaning liquid may overflow a storage tank.

BRIEF SUMMARY OF THE INVENTION

The present disclosure provides a nozzle cleaning device, a nozzle cleaning method, and a substrate processing apparatus capable of uniformly cleaning a nozzle from a front end of the nozzle to an upper part thereof.

In accordance with one aspect of the illustrative embodiments, there is provided a nozzle cleaning device including a storage tank having a cylindrical inner peripheral surface and configured to store therein a cleaning liquid that cleans a nozzle used in a substrate process; a liquid discharging portion configured to discharge the cleaning liquid into the storage tank toward a position eccentric with respect to a central axis of the cylindrical inner peripheral surface to store the cleaning liquid within the storage tank and configured to form a vortex flow of the cleaning liquid revolving within the storage tank; and an overflow discharging portion configured to discharge the cleaning liquid that overflows the storage tank.

Further, in accordance with another aspect of the illustrative embodiments, there is provided a nozzle cleaning method that includes inserting at least one nozzle used in substrate processes into a storage tank having a cylindrical inner peripheral surface; cleaning the at least one nozzle by discharging a cleaning liquid into the storage tank toward a position eccentric with respect to a central axis of the cylindrical inner peripheral surface of the storage tank to store the cleaning liquid in the storage tank and to immerse the at least one nozzle therein; and by forming a vortex flow that revolves within the storage tank; and allowing the cleaning liquid to overflow the storage tank and discharging the overflowed cleaning liquid through an overflow discharging portion.

Furthermore, in accordance with still another aspect of the illustrative embodiments, there is provided a substrate processing apparatus including a nozzle configured to discharge a fluid toward a substrate; an arm configured to support and move the nozzle; and the nozzle cleaning device described above.

In accordance with the illustrative embodiments, it is possible to uniformly clean a nozzle from a front end of the nozzle to an upper part thereof.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments of a nozzle cleaning device, a nozzle cleaning method, and a substrate processing apparatus will be described in detail with reference to the accompanying drawings so that inventive concept may be readily implemented by those skilled in the art. However, it is to be noted that the present disclosure is not limited to the illustrative embodiments but can be realized in various other ways.

First Illustrative Embodiment

<Configuration of Substrate Processing System>

Figure 1:
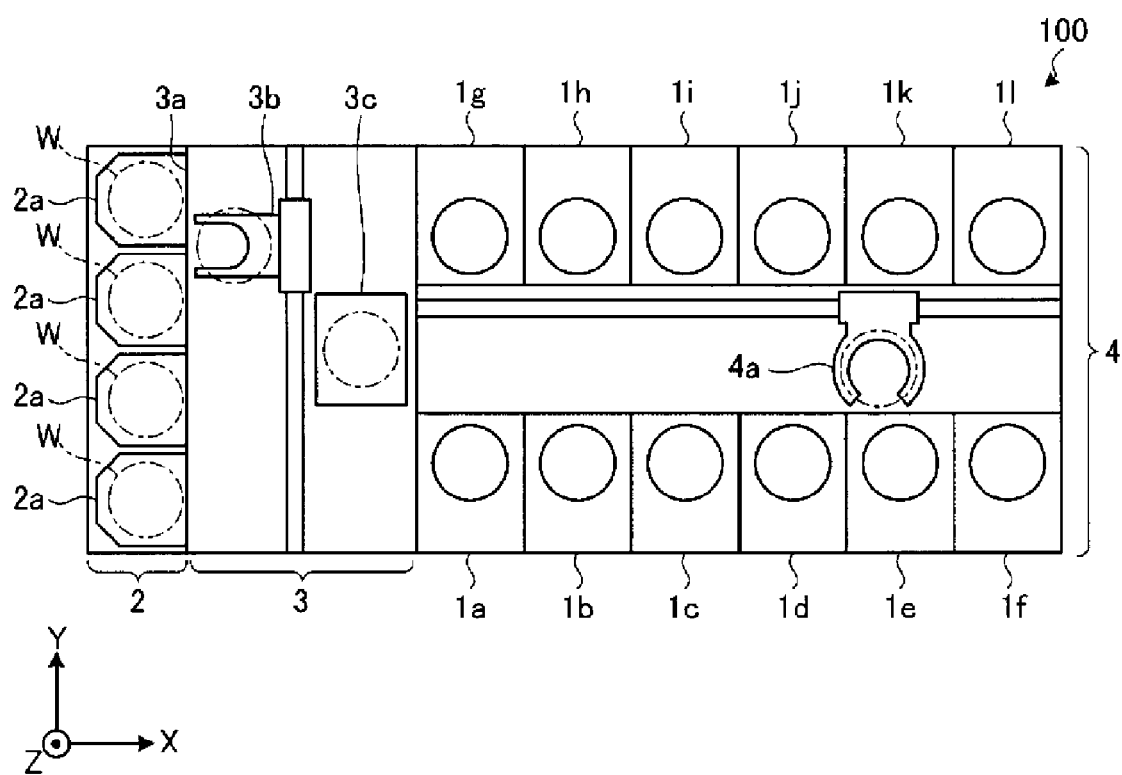
FIG. 1 illustrates a configuration of a substrate processing system in accordance with a first illustrative embodiment.

A configuration of substrate processing system in accordance with a first illustrative embodiment will be explained with reference to FIG. 1. FIG. 1 illustrates the configuration of the substrate processing system in accordance with the first illustrative embodiment.

Hereinafter, an X-axis, a Y-axis, and a Z-axis orthogonal to one another are defined, and a positive direction of the Z-axis is set as a upwardly vertical direction for clearness in positional relationships. Further, hereinafter, a negative direction of the X-axis is set as a forward direction of the substrate processing system and a positive direction of the X-axis is set as a backward direction of the substrate processing system.

As depicted in FIG. 1, a substrate processing system 100 includes a substrate loading/unloading unit 2, a substrate transferring unit 3, and a substrate processing unit 4. The substrate loading/unloading unit 2, the substrate transferring unit 3, and the substrate processing unit 4 are connected in sequence from the forward direction of the substrate processing system 100 to the backward direction thereof.

The substrate loading/unloading unit 2 is configured to load/unload multiple (for example, about 25) substrates W into/from a carrier 2a. In the substrate loading/unloading unit 2, for example, four carriers 2a may be arranged side by side while adhering to a front wall 3a of the substrate transferring unit 3.

The substrate transferring unit 3 is positioned at a back of the substrate loading/unloading unit 2, and includes therein a substrate transferring device 3b and a substrate transiting table 3c. The substrate transferring unit 3 transfers a substrate W between the carrier 2a arranged in the substrate loading/unloading unit 2 and the substrate transiting table 3c by using the substrate transferring device 3b.

The substrate processing unit 4 is positioned at a back of the substrate transferring unit 3. The substrate processing unit 4 includes a substrate transferring device 4a at a central portion thereof, and both sides of the substrate transferring device 4a respectively include multiple (herein, about 6) substrate processing apparatuses 1a to 1l arranged side by side in the forward/backward direction (in a direction parallel to the X-axis).

The substrate transferring device 4a is configured to transfer each substrate W between the substrate transiting table 3c of the substrate transferring unit 3 and the respective substrate processing apparatuses 1a to 1l, and each of the substrate processing apparatuses 1a to 1l process the substrates W one by one.

<Configuration of Substrate Processing Apparatus>

Figure 2:
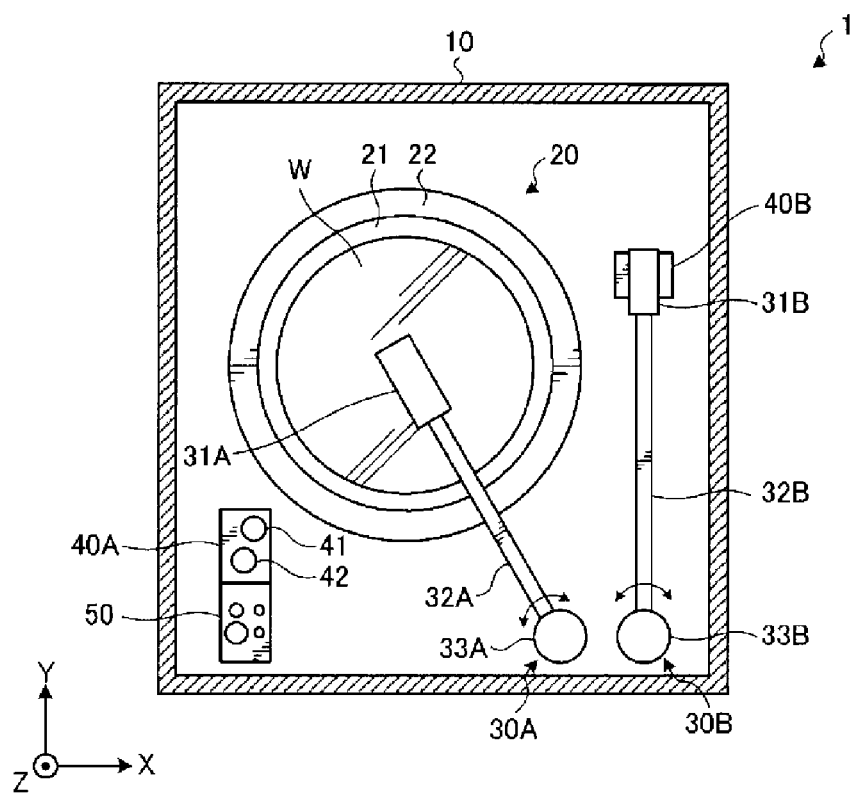
FIG. 2 is a schematic plane view of a configuration of a substrate processing apparatus in accordance with the first illustrative embodiment.

Hereinafter, a configuration of a substrate processing apparatus in accordance with the first illustrative embodiment will be explained with reference to FIG. 2. FIG. 2 is a schematic plane view of the configuration of the substrate processing apparatus in accordance with the first illustrative embodiment.

As depicted in FIG. 2, a substrate processing apparatus 1 is configured to process a substrate W by using various kinds of processing liquids discharged through a nozzle. To be specific, the substrate processing apparatus includes a substrate holding unit 20, processing liquid supplying units 30A and 30B, nozzle standby units 40A and 40B, and a nozzle cleaning device 50 within a processing chamber 10.

The substrate holding unit 20 includes a rotation holding device 21 configured to hold the substrate W to be rotated and a processing liquid collecting device 22 provided to surround the rotation holding device 21. The substrate holding unit 20 is configured to rotate the substrate W by using the rotation holding device 21 and to collect a processing liquid scattered to an outside of the substrate W due to a centrifugal force caused by the rotation of the substrate W through the processing liquid collecting device 22.

Further, the rotation holding device 21 is configured to hold the substrate W in a substantially horizontal manner and to rotate the held substrate W around a vertical axis.

The processing liquid supplying units 30A and 30B are configured to supply a processing liquid from above the substrate W held by the substrate holding unit 20 toward the substrate W. The processing liquid supplying units 30A and 30B include discharging devices 31A and 31B configured to discharge a processing liquid, arms 32A and 32B configured to horizontally support the discharging devices 31A and 31B, and rotation elevating devices 33A and 33B configured to rotate and elevate the arms 32A and 32B, respectively.

Further, the arms 32A and 32B and the rotation elevating devices 33A and 33B are provided as an example for supporting and moving a nozzle.

The discharging devices 31A and 31B include nozzles configured to discharge a processing liquid toward the substrate W. To be specific, the substrate processing apparatus 1 includes a first nozzle configured to discharge a SPM (Sulfuric Acid Hydrogen Peroxide Mixture), a second nozzle configured to discharge a SC1, and a third nozzle configured to mix a processing liquid with a gas and discharge the mixture in a misty state. The first nozzle and the third nozzle are provided in the discharging device 31A, and the second nozzle is provided in the discharging device 31B.

The SPM is a mixed solution of $H_2SO_4$ and $H_2O_2$, and the SC1 is a mixed solution of ammonia water, hydrogen peroxide water, and water.

Figure 3:
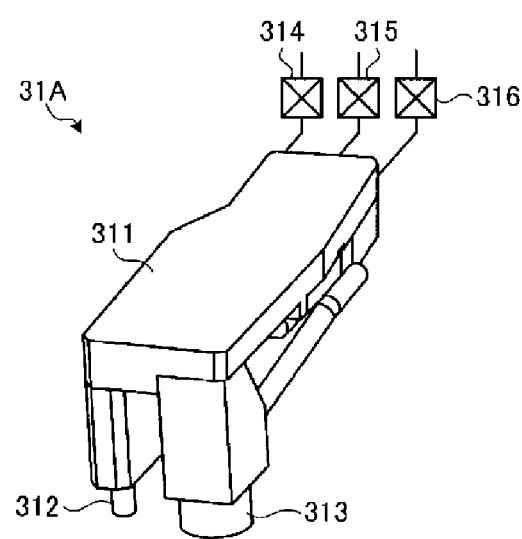
FIG. 3 is a schematic perspective view of a configuration of a discharging device.

Herein, a configuration of the discharging device 31A including the first nozzle and the third nozzle will be explained with reference to FIG. 3. FIG. 3 is a schematic perspective view of the configuration of the discharging device 31A.

As depicted in FIG. 3, the discharging device 31A includes a base portion 311, a first nozzle 312, and a third nozzle 313.

The base portion 311 is connected to a front end of the arm 32A. The first nozzle 312 and the third nozzle 313 are provided to be adjacent to each other at a lower front end of the base portion 311.

The first nozzle 312 is connected to a non-illustrated SPM supply source via a valve 314 and configured to discharge a SPM supplied from the SPM supply source via the valve 314 in a vertically downward direction.

The third nozzle 313 is a dual fluid nozzle configured to mix a liquid with a gas and discharge the mixture. The third nozzle 313 includes a first discharge opening connected to a non-illustrated processing liquid supply source via a valve 315 and a second discharge opening connected to a non-illustrated gas supply source via a valve 316.

The third nozzle 313 discharges a processing liquid through the first discharge opening and discharges a gas ($N_2$) through the second discharge opening. Thus, the processing liquid and the gas are mixed outside the third nozzle 313 to form a processing liquid in a misty state. As a result, the processing liquid in a misty state is supplied to the substrate W.

The first nozzle 312 and the third nozzle 313 are connected to a non-illustrated flow rate controller. The flow rate controller is configured to control a flow rate of the processing liquid and the gas discharged through the first nozzle 312 and the third nozzle 313. The flow rate controller and the valves 314 to 316 are controlled by a control unit to be described later.

As described above, the discharging device 31A includes both the first nozzle 312 and the third nozzle 313.

Here, a cohesive material formed from the dried and solidified SPM may adhere to the first nozzle 312 configured to discharge the SPM. Further, in the discharging device 31A, such a cohesive material may adhere not only to the first nozzle 312 but also to the third nozzle 313 adjacent to the first nozzle 312. If a substrate process is performed while such a cohesive material adheres to the first nozzle 312 or the third nozzle 313, the cohesive material may be scattered on the substrate W, so that the substrate W may be damaged.

Meanwhile, the substrate processing apparatus 1 in accordance with the first illustrative embodiment can remove the cohesive material adhering to the first nozzle 312 and the third nozzle 313 by cleaning the first nozzle 312 and the third nozzle 313 with the nozzle cleaning device 50. The nozzle cleaning device 50 allows a cleaning liquid to overflow, so that the nozzle is immersed to be cleaned. As compared with the conventional cleaning device, the nozzle cleaning device 50 can clean the nozzle from a front end of the nozzle to an upper part thereof. Details thereof will be explained later.

The discharging device 31B includes a base portion connected to the arm 32B and a second nozzle provided at a lower front end of the base portion. The second nozzle is connected to a non-illustrated SC1 supply source via a non-illustrated valve and configured to discharge a SC1 supplied from the SC1 supply source in a vertically downward direction.

The nozzle standby units 40A and 40B are provided at standby positions of the processing liquid supplying units 30A and 30B, respectively. Further, the nozzle standby units 40A and 40B include accommodating portions configured to accommodate the nozzles of the processing liquid supplying units 30A and 30B, respectively.

To be specific, the nozzle standby unit 40A includes a first accommodating portion 41 for accommodating the first nozzle 312 and a second accommodating portion 42 for accommodating the third nozzle 313. The nozzle standby unit 40B includes an accommodating portion (not illustrated) for accommodating the second nozzle. The processing liquid supplying units 30A and 30B allow the nozzles to be accommodated in the accommodating portions of the nozzle standby units 40A and 40B and to stand by while appropriately discharging a processing liquid through the nozzles in order to prevent the processing liquid from being deteriorated.

The nozzle cleaning device 50 is configured to clean the first nozzle 312 and the third nozzle 313 of the processing liquid supplying unit 30A, and is disposed to be adjacent to the nozzle standby unit 40A.

<Configuration of Nozzle Cleaning Device>

Figure 4:
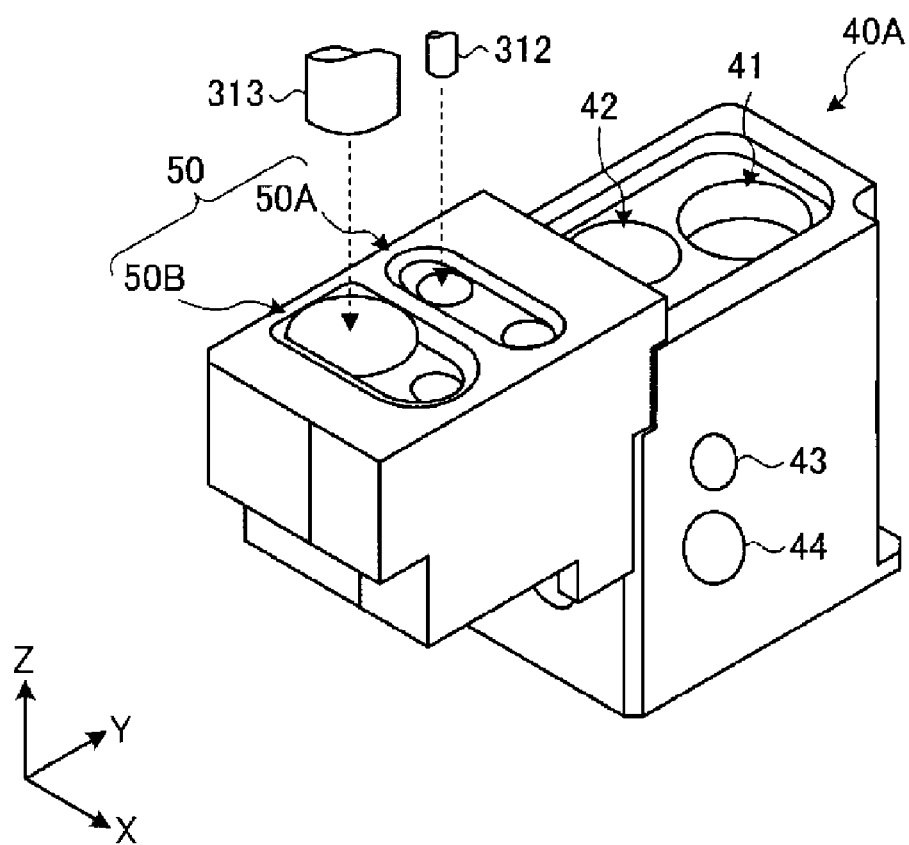
FIG. 4 is a schematic perspective view of a configuration of a nozzle cleaning device.

Hereinafter, a configuration of the nozzle cleaning device 50 will be explained with reference to FIG. 4. FIG. 4 is a schematic perspective view of the configuration of the nozzle cleaning device 50.

As depicted in FIG. 4, the nozzle cleaning device 50 includes a first cleaning unit 50A configured to clean the first nozzle 312 and a second cleaning unit 50B configured to clean the third nozzle 313. Further, the nozzle cleaning device 50 is configured to clean the first nozzle 312 and the third nozzle 313 individually or simultaneously.

The nozzle standby unit 40A includes a first drain portion 43 configured to discharge the SPM stored in the first accommodating portion 41 to the outside, and a second drain portion 44 configured to discharge the processing liquid stored in the second accommodating portion 42 to the outside. The nozzle cleaning device 50 is connected to the nozzle standby unit 40A, and the cleaning liquid used for cleaning the nozzles in the nozzle cleaning device 50 is discharged through the first drain portion 43 and the second drain portion 44 of the nozzle standby unit 40A.

Figure 5:
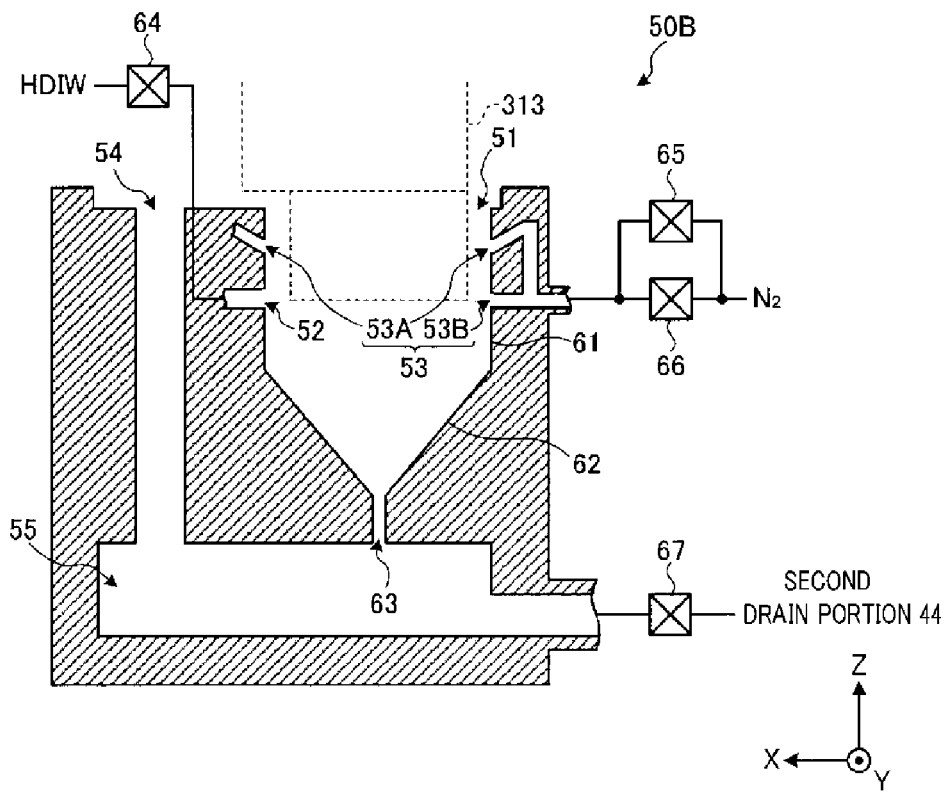
FIG. 5 is a schematic side cross sectional view of a configuration of a second cleaning unit.

Hereinafter, a configuration of the second cleaning unit 50B configured to clean the third nozzle 313 will be explained with reference to FIG. 5. FIG. 5 is a schematic side cross sectional view of the configuration of the second cleaning unit 50B. Since the first cleaning unit 50A has substantially the same configuration as that of the second cleaning unit 50B, only the configuration of the second cleaning unit 50B will be explained and an explanation of the first cleaning unit 50A will be omitted.

As depicted in FIG. 5, the second cleaning unit 50B includes a storage tank 51, a liquid discharging portion 52, a gas injecting portion 53, an overflow discharging portion 54, and a liquid collecting portion 55.

The storage tank 51 has a cylindrical inner peripheral surface 61 and stores a cleaning liquid for cleaning the third nozzle 313. The cleaning liquid is, for example, HDIW. The HDIW is high-temperature deionized water heated at a preset temperature (from about 45° C. to about 80° C.) higher than the room temperature (for example, about 20° C.). By using the HDIW as the cleaning liquid, it is possible to perform a cleaning efficiently as compared with a case where the room-temperature deionized water CDIW is used.

Further, the storage tank 51 has a funnel-shaped bottom surface 62 connected to the cylindrical inner peripheral surface 61. At a vertex of the bottom surface 62, there is formed a discharge opening 63 that connects the storage tank 51 to the liquid collecting portion 55. The cleaning liquid stored in the storage tank 51 is collected in the liquid collecting portion 55 through the discharge opening 63.

Thus, since the bottom surface 62 of the storage tank 51 has a funnel shape, the cleaning liquid stored in the storage tank 51 can be discharged efficiently through the discharge opening 63.

In the first illustrative embodiment, the vertex of the funnel-shaped bottom surface 62 is positioned at the substantially same axis as a central axis of the inner peripheral surface 61 of the storage tank 51. However, the "funnel shape" is not limited to thereto and may allow the vertex of the funnel to be positioned eccentrically with respect to the central axis of the inner peripheral surface of the storage tank 51. Details thereof will be explained in a third illustrative embodiment.

The liquid discharging portion 52 is configured to discharge the cleaning liquid into the storage tank 51. To be specific, the liquid discharging portion 52 is connected to a supply source of the HDIW as the cleaning liquid via a valve 64 and discharges the HDIW supplied from the HDIW supply source via the valve 64 into the storage tank 51. Opening and closing of the valve 64 is controlled by the control unit to be described later.

The liquid discharging portion 52 is configured to supply the cleaning liquid in an amount more than the cleaning liquid discharged through the discharge opening 63 of the storage tank 51. Thus, the cleaning liquid is stored within the storage tank 51.

Figure 6:
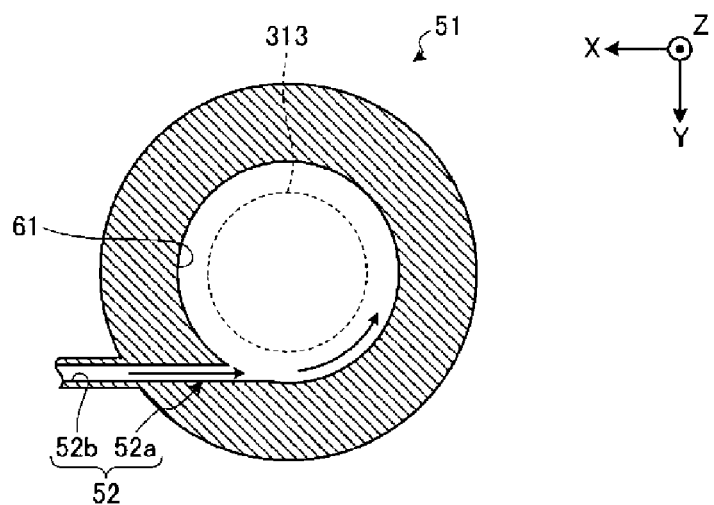
FIG. 6 is a schematic plane cross sectional view illustrating an arrangement of a liquid discharging portion.

Further, the liquid discharging portion 52 discharges the cleaning liquid within the storage tank 51 toward a position eccentric with respect to the central axis of the inner peripheral surface 61 of the storage tank 51 to form a vortex flow of the cleaning liquid within the storage tank 51. Hereinafter, an arrangement of the liquid discharging portion 52 will be explained with reference to FIG. 6. FIG. 6 is a schematic plane cross sectional view illustrating the arrangement of the liquid discharging portion 52.

As depicted in FIG. 6, the liquid discharging portion 52 includes a discharge opening 52a formed along a tangential direction of the inner peripheral surface 61 of the storage tank 51 and a flow path 52b communicating with the discharge opening 52a. The cleaning liquid discharged from the liquid discharging portion 52 flows along the inner peripheral surface 61 of the storage tank 51. Thus, a vortex flow of the cleaning liquid is formed within the storage tank 51.

As described above, since the liquid discharging portion 52 discharges the cleaning liquid along the inner peripheral surface 61 of the storage tank 51, the cleaning liquid can be stored within the storage tank 51 and the vortex flow revolving within the storage tank 51 can be formed.

The second cleaning unit 50B immerses and cleans the third nozzle 313 by using the cleaning liquid stored within the storage tank 51. Thus, the second cleaning unit 50B can clean the third nozzle 313, inserted into the storage tank 51, from the front end of the nozzle to the upper part thereof. Further, the second cleaning unit 50B forms a vortex flow within the storage tank 51, so that a cleaning effect of the third nozzle 313 can be increased.

Furthermore, the second cleaning unit 50B allows the cleaning liquid within the storage tank 51 to overflow, so that the third nozzle 313 is immersed to be cleaned as described later. Thus, a contaminant such as the cohesive material removed from the third nozzle 313 can be discharged to the outside of the storage tank 51, and the vortex flow can be formed continuously within the storage tank 51.

In order to form a vortex flow within the storage tank 51, the cleaning liquid discharged from the liquid discharging portion 52 just needs to resultingly flow along the inner peripheral surface 61 of the storage tank 51, but the liquid discharging portion 52 does not need to discharge the cleaning liquid along the inner peripheral surface 61 of the storage tank 51. That is, the liquid discharging portion 52 just needs to discharge the cleaning liquid within the storage tank 51 toward a position eccentric with respect to the central axis of the inner peripheral surface 61 of the storage tank 51.

Further, the liquid discharging portion 52 is located at a vertical position substantially equal to a front end surface of the third nozzle 313 inserted into the storage tank 51 as depicted in FIG. 5. Thus, the liquid discharging portion 52 can form a vortex flow near the front end surface of the third nozzle 313. Therefore, it is possible to effectively clean the front end surface of the third nozzle 313 to which the cohesive material of SPM may easily adhere.

The gas injecting portion 53 is configured to inject a gas ($N_2$) into the storage tank 51. The gas injecting portion 53 includes an upper injecting portion 53A (corresponding to a first injecting portion) and a lower injecting portion 53B (corresponding to a second injecting portion).

Each of the upper injecting portion 53A and the lower injecting portion 53B includes an injection opening formed at the inner peripheral surface 61 of the storage tank 51 and a flow path communicating with the injection opening. The flow path of the upper injecting portion 53A and the flow path of the lower injecting portion 53B communicate with each other, and are connected to a non-illustrated gas supply source. Further, a line connecting the upper injecting portion 53A and the lower injecting portion 53B to the gas supply source includes a first valve 65 and a second valve 66 arranged in parallel with each other.

The upper injecting portion 53A and the lower injecting portion 53B inject the gas ($N_2$) supplied from the non-illustrated gas supply source via the first valve 65 or the second valve 66 into the storage tank 51, so that the cleaning liquid remaining on a surface of the third nozzle 313 after the cleaning of the nozzle can be removed. Opening and closing of the first valve 65 and the second valve 66 is controlled by the control unit to be described later.

Figure 7:
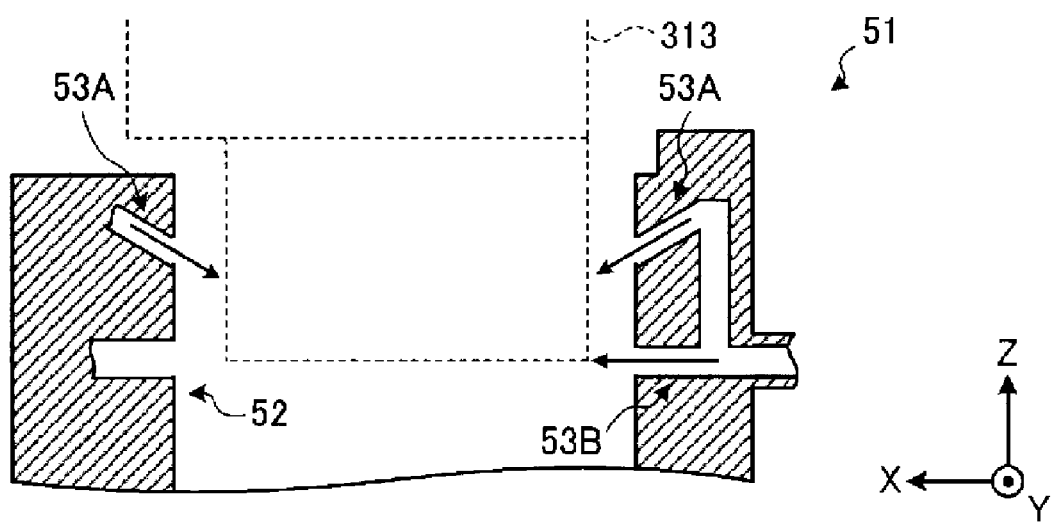
FIG. 7 is a schematic side cross sectional view illustrating directions of a gas injected by an upper injecting portion and a lower injecting portion.

Hereinafter, a direction of a gas injected by each of the upper injecting portion 53A and the lower injecting portion 53B will be explained with reference to FIG. 7. FIG. 7 is a schematic side cross sectional view illustrating directions of a gas injected by the upper injecting portion 53A and the lower injecting portion 53B.

As depicted in FIG. 7, the upper injecting portion 53A is located at a vertical position higher than the front end surface of the third nozzle 313 inserted into the storage tank 51, and is configured to inject the gas supplied from the gas supply source in a downwardly inclined direction. Thus, the upper injecting portion 53A blows away the cleaning liquid remaining at an outer peripheral surface of the third nozzle 313 to dry the third nozzle 313.

Since the upper injecting portion 53A injects the gas in the downwardly inclined direction, it is possible to prevent the cleaning liquid removed from the third nozzle 313 from being scattered to the outside of the storage tank 51.

The lower injecting portion 53B is located at a vertical position substantially equal to the front end surface of the third nozzle 313 inserted into the storage tank 51, and is configured to inject the gas in a substantially horizontal direction toward the front end surface of the third nozzle 313. Thus, the lower injecting portion 53B mainly dries the front end surface of the third nozzle 313 where the cleaning liquid easily remains.

Figure 8A:
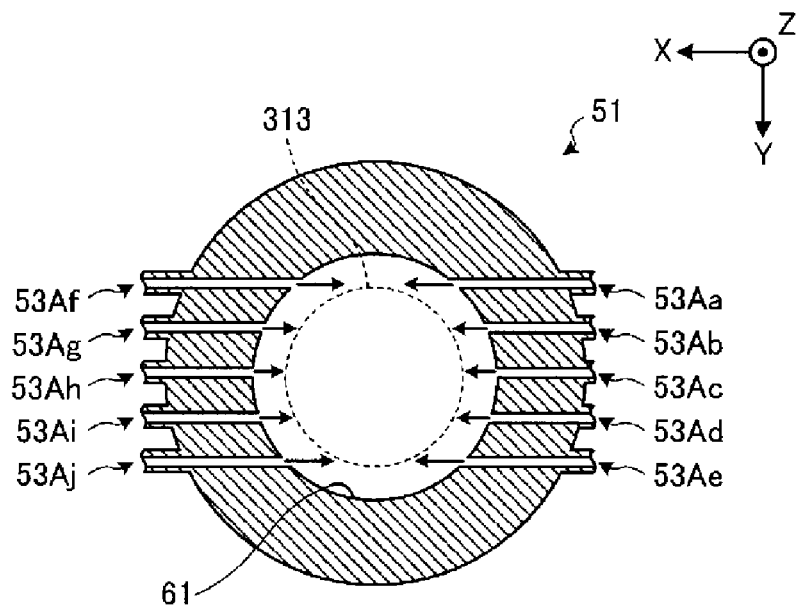
FIG. 8A is a schematic plane cross sectional view illustrating an arrangement of the upper injecting portions.
Figure 8B:
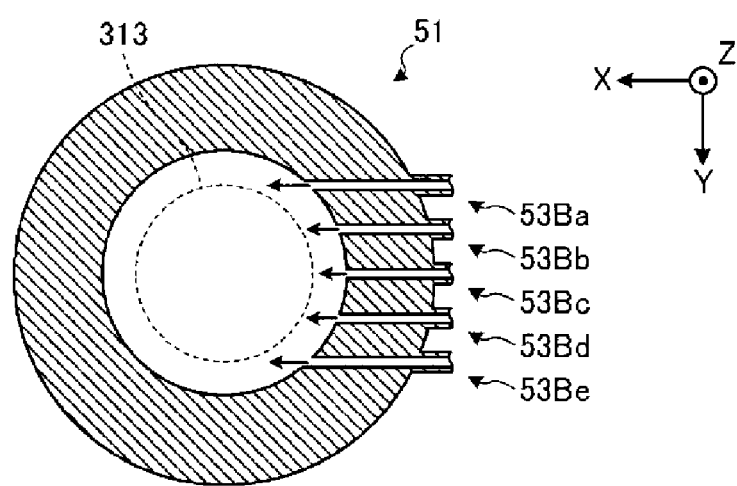
FIG. 8B is a schematic plane cross sectional view illustrating an arrangement of the lower injecting portions.

The gas injecting portion 53 includes multiple upper injecting portions 53A and multiple lower injecting portions 53B. Hereinafter, an arrangement of the upper injecting portions 53A and an arrangement of the lower injecting portions 53B will be explained with reference to FIGS. 8A and 8B. FIG. 8A is a schematic plane cross sectional view illustrating an arrangement of the upper injecting portions 53A, and FIG. 8B is a schematic plane cross sectional view illustrating an arrangement of the lower injecting portions 53B.

As depicted in FIG. 8A, the gas injecting portion 53 includes ten upper injecting portions 53Aa to 53Aj. Among them, the upper injecting portions 53Aa to 53Ae are arranged in parallel to one another at one side of the inner peripheral surface 61 of the storage tank 51, and are configured to inject the gas toward the other side of the inner peripheral surface 61 of the storage tank 51. Further, the other upper injecting portions 53Af to 53Aj are arranged in parallel to one another at the other side of the inner peripheral surface 61 of the storage tank 51, and are configured to inject the gas toward the one side of the inner peripheral surface 61 of the storage tank 51.

As described above, the multiple upper injecting portions 53Aa to 53Aj inject the gas ($N_2$) toward the third nozzle 313 from the both sides of the third nozzle 313. Thus, the gas can be supplied to substantially the entire outer peripheral surface of the third nozzle 313, so that the outer peripheral surface of the third nozzle 313 can be dried more effectively.

FIG. 8A illustrates an example where the upper injecting portions 53Aa to 53Ae and the upper injecting portions 53Af to 53Aj inject the gas in a direction parallel to their arrangement direction (X-axis direction), i.e., in a direction facing each other.

Figure 9:
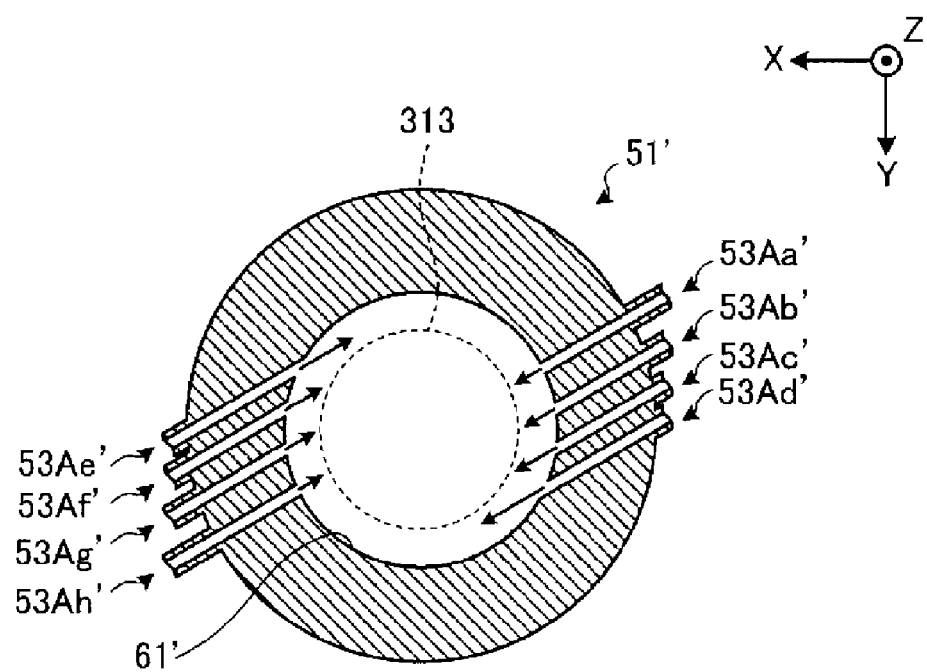
FIG. 9 is a schematic plane cross sectional view illustrating another arrangement example of upper injecting portions.

However, the present disclosure is not limited thereto. The upper injecting portions arranged at the one side of the third nozzle 313 and the upper injecting portions arranged at the other side of the third nozzle 313 may inject the gas in an inclined direction with respect to their arrangement direction. Details thereof will be explained with reference to FIG. 9. FIG. 9 is a schematic plane cross sectional view illustrating another arrangement example of upper injecting portions.

As depicted in FIG. 9, four upper injecting portions 53Aa' to 53Ad' are arranged at the one side of the third nozzle 313 in a storage tank 51' and four upper injecting portions 53Ae' to 53Ah' are arranged at the other side of the third nozzle 313. Hereinafter, the upper injecting portions 53Aa' to 53Ad' will be referred to as "one-side upper injecting portions 53Aa' to 53Ad'" and the upper injecting portions 53Ae' to 53Ah' will be referred to as "other-side upper injecting portions 53Ae' to 53Ah'".

The one-side upper injecting portions 53Aa' to 53Ad' and the other-side upper injecting portions 53Ae' to 53Ah' are arranged such that their injection openings are parallel to the X-axis direction. To be specific, the injection openings of the one-side upper injecting portions 53Aa' to 53Ad' are arranged toward the positive direction of the X-axis of the third nozzle 313 and the injection openings of the other-side upper injecting portions 53Ae' to 53Ah' are arranged toward the negative direction of the X-axis of the third nozzle 313.

When viewed from the top, the one-side upper injecting portions 53Aa' to 53Ad' and the other-side upper injecting portions 53Ae' to 53Ah' injects the gas in an inclined direction with respect to the arrangement direction of their injection openings (i.e., X-axis direction).

To be specific, an inclination of the direction of the injected gas to the arrangement direction (i.e., X-axis direction) is set such that a gas injection range of the one-side upper injecting portions 53Aa' to 53Ad' is not overlapped with a gas injection range of the other-side upper injecting portions 53Ae' to 53Ah'.

With this configuration, it is possible to securely prevent the gas injected by the one-side upper injecting portions 53Aa' to 53Ad' from colliding with the gas injected by the other-side upper injecting portions 53Ae' to 53Ah'. As a result, since the gases are not collided with each other, it is possible to prevent a wind pressure from being decreased, and also prevent the cleaning liquid from remaining on the outer peripheral surface of the third nozzle 313. Further, since a vortex flow of the gas can be formed within the storage tank 51, it is possible to dry the outer peripheral surface of the third nozzle 313 more efficiently.

Herein, there has been explained the example where the inclination of the direction of the injected gas is set such that the gas injection range of the one-side upper injecting portions 53Aa' to 53Ad' is not overlapped with the gas injection range of the other-side upper injecting portions 53Ae' to 53Ah'. However, the present disclosure is not limited thereto. The gas injection range of the one-side upper injecting portions 53Aa' to 53Ad' may be partially overlapped with the gas injection range of the other-side upper injecting portions 53Ae' to 53Ah'. In this case, it is possible to prevent the gases from colliding with each other by, for example, arranging the one-side upper injecting portions 53Aa' to 53Ad' not to directly face the other-side upper injecting portions 53Ae' to 53Ah'.

Hereinafter, an arrangement of the lower injecting portion 53B will be explained. As depicted in FIG. 8B, the gas injecting portion 53 includes five lower injecting portions 53Ba to 53Be. These lower injecting portions 53Ba to 53Be are arranged in parallel to one another at the one side of the storage tank 51, and configured to inject the gas toward the other side of the storage tank 51.

As described above, the multiple lower injecting portions 53Ba to 53Be inject the gas ($N_2$) toward the third nozzle 313 from the one side of the third nozzle 313. Further, as described above, the lower injecting portions 53Ba to 53Be located at the vertical position substantially equal to the front end surface of the third nozzle 313 is configured to inject the gas in a substantially horizontal direction toward the front end surface thereof. For this reason, if the lower injecting portions 53B are located at both sides of the storage tank 51, there may be a collision between the gases, so that the front end surface of the third nozzle 313 may not be sufficiently dried.

Accordingly, in the nozzle cleaning device 50, the lower injecting portions 53Ba to 53Be are located only at the one side of the inner peripheral surface 61 of the storage tank 51, and, thus, the front end surface of the third nozzle 313 can be dried efficiently.

Although there has been explained the example where the gas injecting portion 53 includes the ten upper injecting portions 53Aa to 53Aj and the five lower injecting portions 53Ba to 53Be, the number of the upper injecting portions and the number of the lower injecting portions are not limited to the above numbers.

Hereinafter, one of the upper injecting portions 53Aa to 53Aj will be simply referred to "upper injecting portion 53A". Likewise, one of the lower injecting portions 53Ba to 53Be will be simply referred to as "lower injecting portion 53B".

Referring back to FIG. 5, the second cleaning unit 50B will be explained. The overflow discharging portion 54 is configured to discharge the cleaning liquid that overflows the storage tank 51 to be collected in the liquid collecting portion 55.

As described above, since the second cleaning unit 50B includes the overflow discharging portion 54, the cleaning liquid can be filled to the top portion of the storage tank 51. Thus, it is possible to easily clean the third nozzle 313 from the front end of the nozzle 313 to the upper part thereof.

Further, since a contaminant such as the cohesive material removed from the third nozzle 313 can be discharged to the outside of the storage tank 51 through the overflow discharging portion 54, it is possible to prevent the contaminant removed from the third nozzle 313 from adhering again to the third nozzle 313.

Furthermore, since the overflow discharging portion is provided, the cleaning liquid can be continuously supplied into the storage tank 51, so that a vortex flow can be continuously formed within the storage tank 51 during a cleaning process.

The liquid collecting portion 55 is provided below the storage tank 51 and the overflow discharging portion 54, and configured to collect the cleaning liquid introduced from the storage tank 51 through the discharge opening 63 and the cleaning liquid introduced from the overflow discharging portion 54.

The liquid collecting portion 55 is connected to the second drain portion 44 (see FIG. 4) of the nozzle standby unit 40A via a valve 67. Thus, the cleaning liquid collected in the liquid collecting portion 55 is drained to the outside through the valve 67 and the second drain portion 44.

<Operation of Nozzle Cleaning Device>

Hereinafter, a nozzle cleaning process performed by using the second cleaning unit 50B will be explained with reference to FIGS. 10A to 10E. FIGS. 10A to 10E are schematic side cross sectional views each illustrating an operation example of the nozzle cleaning process. Further, respective operations of the second cleaning unit 50B depicted in FIGS. 10A to 10E are controlled by the control unit to be described later.

Figure 10A:
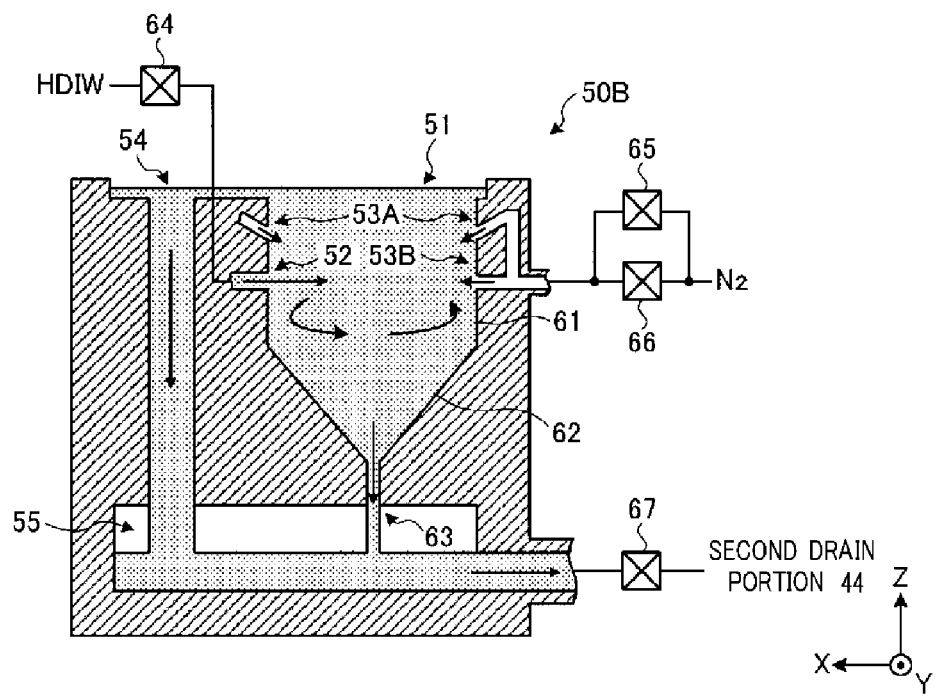
FIG. 10A is a schematic side cross sectional view illustrating an operation example of a nozzle cleaning process.
Figure 10B:
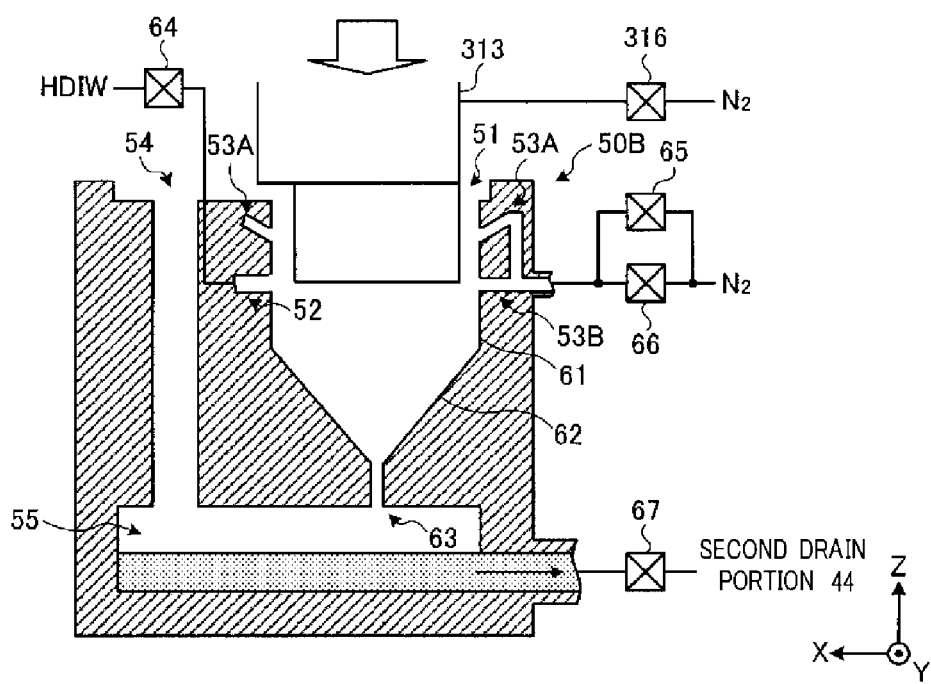
FIG. 10B is a schematic side cross sectional view illustrating an operation example of a nozzle cleaning process.

As depicted in FIG. 10A, before cleaning the third nozzle 313, the second cleaning unit 50B performs a pre-process in which the HDIW as the cleaning liquid is supplied into the storage tank 51 to be stored therein.

In the pre-process, the control unit opens the valve 64 to supply the HDIW as the cleaning liquid from the liquid discharging portion 52. Thus, the cleaning liquid is stored within the storage tank 51. Further, the control unit opens the valve 67. Thus, the cleaning liquid stored within the storage tank 51 and collected in the liquid collecting portion 55 through the discharge opening 63 or the overflow discharging portion 54 is drained to the outside from the second drain portion 44 (see FIG. 4) of the nozzle standby unit 40A.

The control unit opens the first valve 65 before a level of the cleaning liquid stored within the storage tank 51 reaches the vertical position of the lower injecting portions 53B. Then, the gas ($N_2$) is injected from the upper injecting portions 53A and the lower injecting portions 53B.

Thus, the nozzle cleaning device 50 can prevent the cleaning liquid stored within the storage tank 51 from being introduced into flow paths of the upper injecting portions 53A and the lower injecting portions 53B. Further, a flow rate of the gas at the time of opening the first valve 65 is required to prevent the cleaning liquid stored within the storage tank 51 from being introduced into the flow paths of the upper injecting portions 53A and the lower injecting portions 53B.

After the cleaning liquid is discharged from the liquid discharging portion 52 for a certain time, the control unit closes the valve 64. Thus, the discharge of the cleaning liquid from the liquid discharging portion 52 is stopped, and the cleaning liquid stored within the storage tank 51 is discharged through the discharge opening 63. The control unit keeps the first valve 65 and the valve 67 open.

As described above, by performing the pre-process, the HDIW having a lowered temperature and remaining within a line connecting the supply source of the HDIW to the liquid discharging portion 52 can be discharged, and the HDIW having a preset temperature can be immediately discharged during the immersing and cleaning process to be performed later. Further, the storage tank 51 gets warm since the HDIW is stored in the storage tank 51 for a certain time. Therefore, it is possible to suppress a decrease in a temperature of the HDIW during the immersing and cleaning process.

Figure 10C:
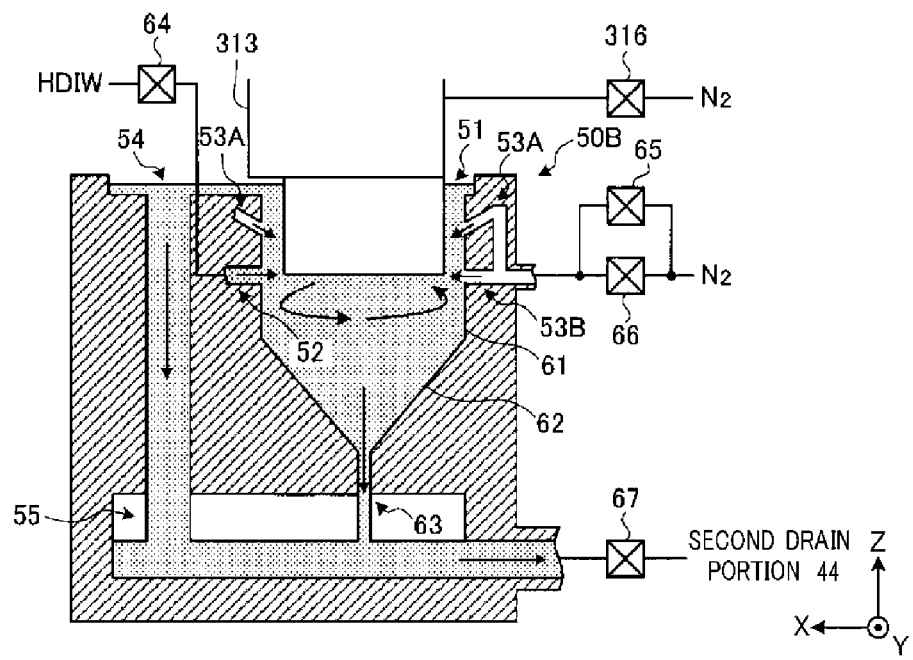
FIG. 10C is a schematic side cross sectional view illustrating an operation example of a nozzle cleaning process.

After the cleaning liquid stored within the storage tank 51 is drained out through the discharge opening 63, the control unit operates the rotation elevating devices 33A to insert the third nozzle 313 into the storage tank 51 (see FIG. 10B), and then, performs the immersing and cleaning process as depicted in FIG. 10C.

Since the third nozzle 313 is inserted into the storage tank 51 after the cleaning liquid stored within the storage tank 51 is drained out through the discharge opening 63, the insertion of the third nozzle 313 does not cause the cleaning liquid to overflow the storage tank 51 or to spatter.

As depicted in FIG. 10C, the control unit opens the valve 64 to allow the liquid discharging portion 52 to discharge the HDIW as the cleaning liquid. Thus, the cleaning liquid can be stored within the storage tank 51 and a vortex flow revolving within the storage tank 51 can be formed. As a result, the third nozzle 313 is immersed in the cleaning liquid and the cohesive material of SPM is removed.

As described above, the second cleaning unit 50B performs the immersing and cleaning of the third nozzle 313. For this reason, a cleaning process can be performed easily and uniformly as compared with the conventional injecting and cleaning process. That is, an uncleaned part of the nozzle 313 can be rarely seen.

Further, the second cleaning unit 50B forms the vortex flow of the cleaning liquid within the storage tank 51 to clean the third nozzle 313. Accordingly, it is possible to remove the cohesive material of SPM adhering to the third nozzle 313 more effectively.

As described above, the discharge opening 63 is positioned at the substantially same axis as the central axis of the inner peripheral surface 61 of the storage tank 51. Thus, the nozzle cleaning device 50 can allow a central position of a vortex formed at the time of discharging the cleaning liquid through the discharge opening 63 to be substantially the same as a central position of the vortex flow. Therefore, it is possible to clean the third nozzle 313 more efficiently by a synergy effect of the vortex flow and the vortex.

Further, since the bottom surface 62 of the storage tank 51 has a funnel shape, the vortex flow can be easily formed.

Furthermore, since the liquid discharging portion 52 is located at the vertical position substantially equal to the front end surface of the third nozzle 313, the vortex flow can be formed near the front end surface of the third nozzle 313. As a result, it is possible to effectively clean the front end surface to which the cohesive material of SPM can easily adhere.

The cleaning liquid stored within the storage tank 51 is collected in the liquid collecting portion 55 through the discharge opening 63 or the overflow discharging portion 54, and then, drained to the outside from the liquid collecting portion 55.

The first valve 65 is kept open. For this reason, in the same manner as the pre-process, since the gas is injected from the upper injecting portions 53A and the lower injecting portions 53B, it is possible to prevent the cleaning liquid from being introduced into the flow paths of the upper injecting portions 53A and the lower injecting portions 53B.

The control unit may open the second valve 66 together with the first valve 65. Thus, a flow rate of the gas injected into the storage tank 51 may be increased and the cleaning liquid stored within the storage tank 51 makes bubbles. With the bubbles, it is possible to clean the third nozzle 313 more effectively. Accordingly, the second cleaning unit 50B may perform a bubbling process in which after the cleaning liquid is stored to a vertical position higher than the injection openings of the gas injecting portion 53, the gas is injected from the gas injecting portion 53 (the upper injecting portions 53A and the lower injecting portions 53B) to make bubbles of the cleaning liquid.

After the cleaning liquid is discharged from the liquid discharging portion 52 for a certain time, the control unit closes the valve 64. Thus, the discharge of the cleaning liquid from the liquid discharging portion 52 is stopped, and then, the cleaning liquid stored within the storage tank 51 is drained out through the discharge opening 63. In this case, the cleaning liquid is discharged to form a vortex flow. Therefore, it is possible to reduce the amount of the cleaning liquid remaining on the outer peripheral surface of the third nozzle 313, and also reduce a time required for performing a drying process to be performed later. Further, the control unit keeps the first valve 65 and the valve 67 open.

The second cleaning unit 50B repeatedly performs the above-described immersing and cleaning process multiple times. To be specific, after the control unit stops the discharge of the cleaning liquid from the liquid discharging portion 52 and the cleaning liquid within the storage tank 51 is drained, the cleaning liquid is discharged again from the liquid discharging portion 52 to perform the immersing and cleaning process. Thus, it is possible to clean the third nozzle 313 more effectively.

Figure 10D:
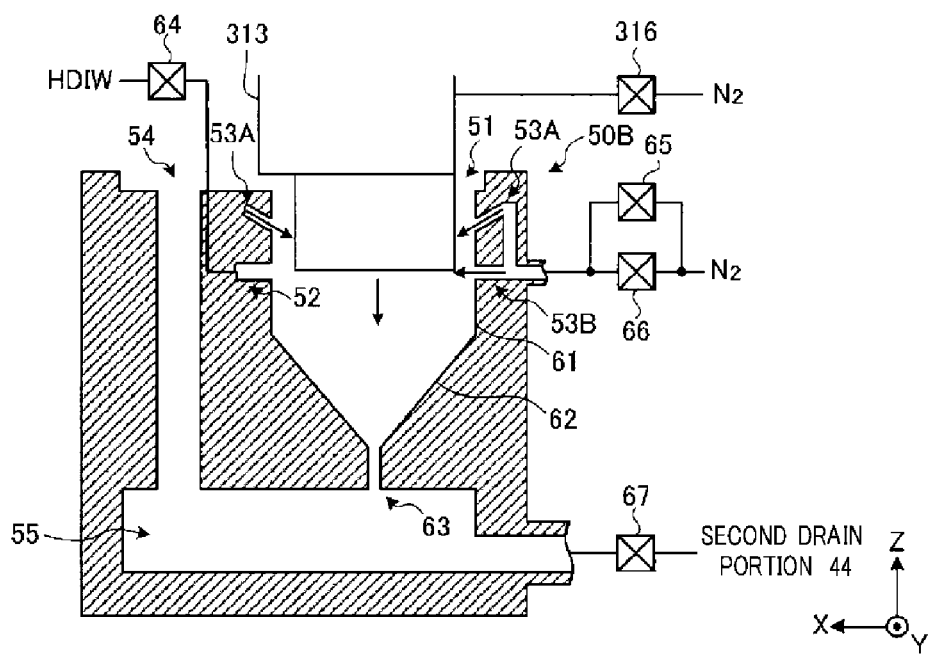
FIG. 10D is a schematic side cross sectional view illustrating an operation example of a nozzle cleaning process.

After the immersing and cleaning process is ended, the second cleaning unit 50B performs the drying process in which the gas is injected to the third nozzle 313 to dry the third nozzle 313 as depicted in FIG. 10D.

In the drying process, the control unit opens the second valve 66 and allows the gas (N$_2$) to be injected from the upper injecting portions 53A and the lower injecting portions 53B at a flow rate higher than that of the pre-process and that of the immersing and cleaning process. As described above, the control unit controls the first valve 65 and the second valve 66 (corresponding to the flow rate controller), so that the flow rate of the gas injected from the gas injecting portion 53 can be set to be different between the immersing and cleaning process and the drying process.

The upper injecting portions 53A inject the gas toward the third nozzle 313 from an upper portion of the front end surface of the third nozzle 313 in the downwardly inclined direction. Thus, it is possible to remove the cleaning liquid remaining on the outer peripheral surface of the third nozzle 313 while preventing the cleaning liquid from being scattered to the outside of the nozzle cleaning device 50.

The lower injecting portions 53B inject the gas toward the front end surface of the third nozzle 313 from the vertical position substantially equal to the front end surface of the third nozzle 313 in the substantially horizontal direction. Thus, it is possible to mainly dry the front end surface of the third nozzle 313 where the cleaning liquid easily remains.

During the drying process, the control unit opens the valve 316 to allow the third nozzle 313 to directly inject the gas (N$_2$). Since the gas is injected directly from the third nozzle 313, the cleaning liquid introduced into the third nozzle 313 during the immersing and cleaning process can be blown away to the outside.

Further, the control unit may perform the above-described drying process while moving the third nozzle 313 up and down. Thus, it is possible to dry the third nozzle 313 more efficiently.

When a certain time passes after the drying process is started, the control unit closes the second valve 66 and the valve 316. Thus, the injection of the gas from the third nozzle 313 is stopped, and the flow rate of the gas injected from the upper injecting portions 53A and the lower injecting portions 53B is reduced. Then, the control unit closes the valve 67.

Figure 10E:
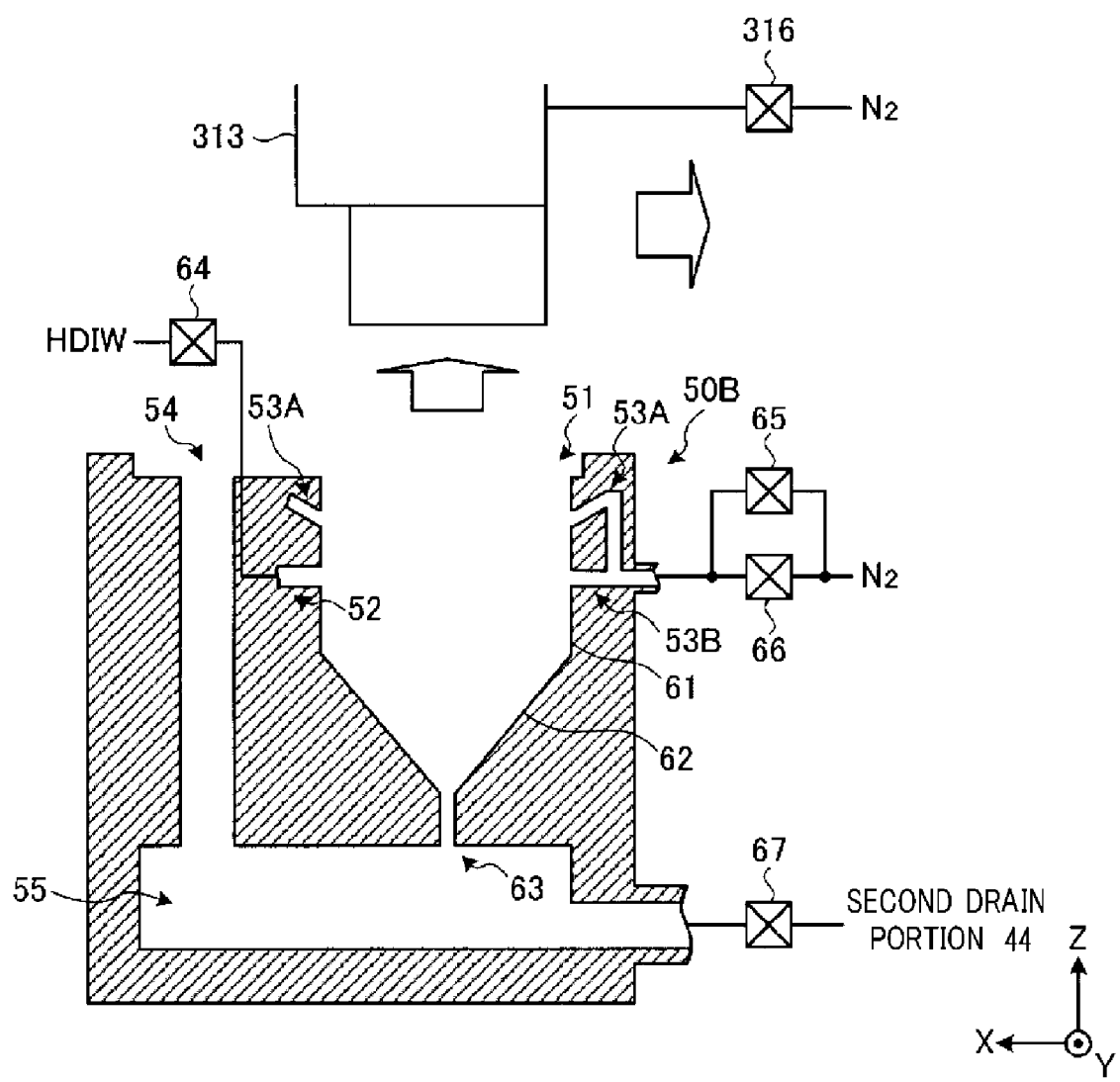
FIG. 10E is a schematic side cross sectional view illustrating an operation example of a nozzle cleaning process.

As depicted in FIG. 10E, the control unit operates the rotation elevating devices 33A to move the third nozzle 313 into the second accommodating portion 42 of the nozzle standby unit 40A. Then, the nozzle cleaning process is ended.

When a series of substrate processes including a SPM process, a SC1 process, and a dual fluid process to be described later are ended, the control unit closes the first valve 65 to stop the injection of the gas from the upper injecting portions 53A and the lower injecting portions 53B. Thus, it is possible to prevent the cleaning liquid within the storage tank 51 from being scattered and from adhering to the substrate W being processed.

<Another Configuration of Substrate Processing Apparatus>

Figure 11:
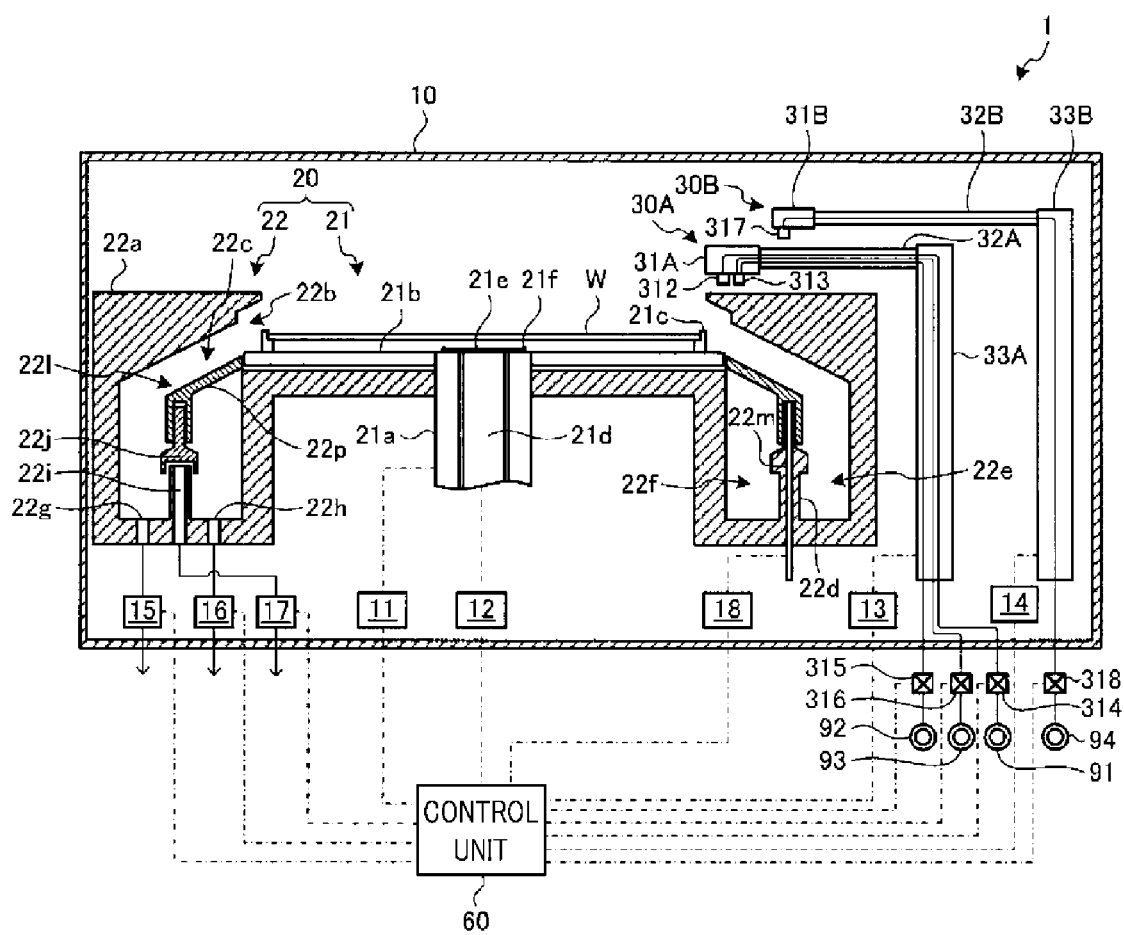
FIG. 11 is a schematic side cross sectional view illustrating a configuration of a substrate processing apparatus.
Figure 12A:
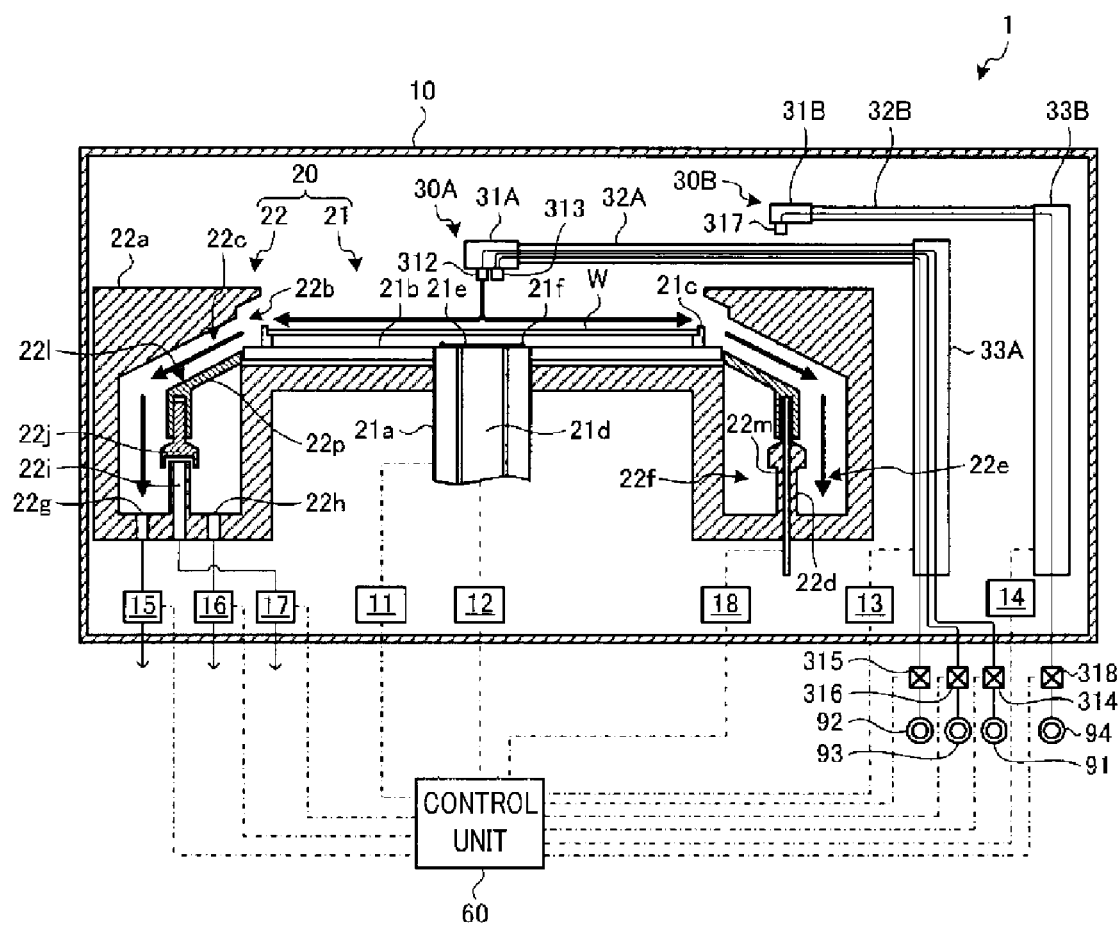
FIG. 12A is a schematic side cross sectional view illustrating an operation example of a substrate process.
Figure 12B:
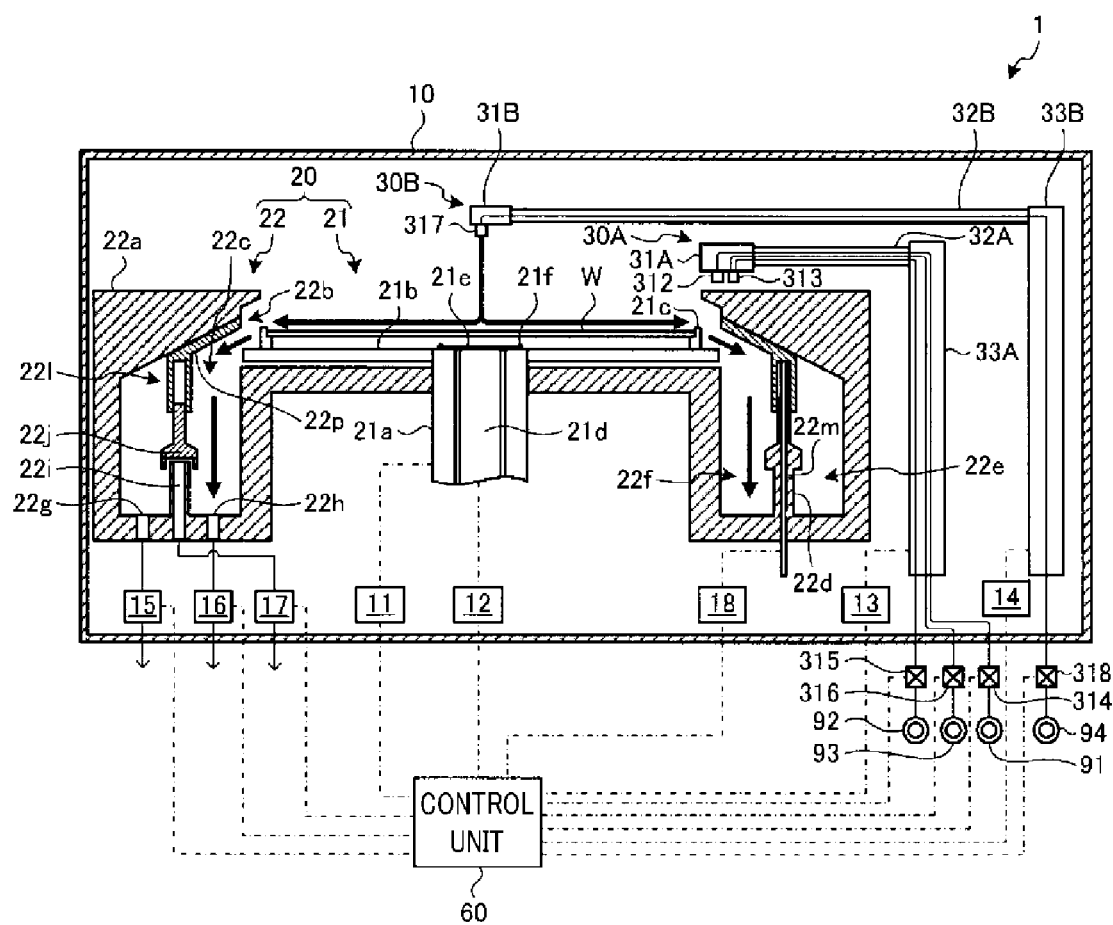
FIG. 12B is a schematic side cross sectional view illustrating an operation example of a substrate process.

Hereinafter, another configuration of the substrate processing apparatus 1 will be explained with reference to FIGS. 11, 12A, and 12B. FIG. 11 is a schematic side cross sectional view illustrating a configuration of the substrate processing apparatus 1. FIGS. 12A and 12B are schematic side cross sectional views each illustrating an operation example of a substrate process.

As depicted in FIG. 11, the substrate processing apparatus 1 includes a control unit 60, and respective operations of the substrate holding unit 20, the processing liquid supplying units 30A and 30B, and the nozzle cleaning device 50 are controlled by the control unit 60.

In the rotation holding device 21 of the substrate holding unit 20, a circular ring-shaped table 21b is horizontally mounted on an upper end of a hollow cylinder-shaped rotation shaft 21a. At a periphery of the table 21b, multiple substrate holding bodies 21c configured to be in contact with a periphery of the substrate W and horizontally hold the substrate W are arranged at a interval along a circumference thereof.

The rotation shaft 21a is connected to a rotation driving device 11. The rotation driving device 11 rotates the rotation shaft 21a and the table 21b, and also rotates the substrate W held on the table 21b by the substrate holding bodies 21c. The rotation driving device 11 is connected to the control unit 60 and its operation is controlled by the control unit 60.

In the substrate holding unit 20, an elevation shaft 21d is inserted in a hollow portion at the center of the rotation shaft 21a and the table 21b to pass therethrough, and a circular plate-shaped elevation plate 21e is mounted on an upper end of the elevation shaft 21d. At a periphery of the elevation plate 21e, multiple elevation pins 21f configured to be in contact with a lower surface of the substrate W and elevate the substrate W are arranged at a interval along the circumference thereof.

The elevation shaft 21d is connected to an elevation device 12, and the elevation device 12 is configured to elevate the elevation shaft 21d and the elevation plate 21e, so that the substrate W held by the elevation pins 21f is also elevated. The elevation device 12 is connected to the control unit 60, and its operation is controlled by the control unit 60.

The processing liquid supplying units 30A and 30B are provided above the table 21b such that the arms 32A and 32B can be moved horizontally. The arms 32A and 32B respectively include the discharging devices 31A and 31B at the front ends thereof. Further, the arms 32A and 32B respectively include the rotation elevating devices 33A and 33B at the base ends thereof.

The rotation elevating devices 33A and 33B are connected to rotation driving devices 13 and 14, respectively. The respective rotation driving devices 13 and 14 horizontally move the arms 32A and 32B and the discharging devices 31A and 31B between a standby position outside the substrate W and a supply position above a central portion of the substrate W. The rotation driving devices 13 and 14 are connected to the control unit 60 and their operations are independently controlled by the control unit 60.

The first nozzle 312 of the processing liquid supplying unit 30A is connected to a SPM supply source 91 via the valve 314. The third nozzle 313 of the processing liquid supplying unit 30A is connected to a processing liquid supply source 92 via the valve 315 and connected to a gas supply source 93 via the valve 316. Further, the second nozzle 317 of the processing liquid supplying unit 30B is connected to a SC1 supply source 94 via the valve 318. These valves 314, 315, 316, and 318 are connected to the control unit 60, and opening and closing thereof are independently controlled by the control unit 60.

The processing liquid collecting device 22 of the substrate holding unit 20 surrounds a lower part and an outer periphery of the substrate W, and includes a collection cup 22a having an open top above the substrate W. In the collection cup 22a, a collection opening 22b is formed outside the outer periphery of the substrate W. Further, a collection space 22c communicating with the collection opening 22b is formed below the collection opening 22b.

Further, in the collection cup 22a, a concentric ring-shaped partition wall 22d is provided at a bottom portion of the collection space 22c, and configured to partition the bottom portion of the collection space 22c into a first collection part 22e and a second collection part 22f in a concentric double ring shape. At bottom portions of the first collection part 22e and the second collection part 22f, multiple discharge openings 22g and 22h are respectively are arranged at an interval along the circumference. The respective discharge openings 22g and 22h are connected to liquid drain lines (not illustrated) via suction devices 15 and 16. Operations of the suction devices 15 and 16 are independently controlled by the control unit 60.

Further, above the discharge openings 22g and 22h and in a middle of the partition wall 22d within the collection cup 22a, multiple gas exhaust openings 22i are formed at an interval along the circumference. The gas exhaust openings 22i are connected to a gas exhaust line (not illustrated) via a suction device 17. An operation of the suction device 17 is controlled by the control unit 60.

Further, right above the gas exhaust openings 22i and in the middle of the partition wall 22d within the collection cup 22a, a fixed cover 22j is provided with a space from the gas exhaust openings 22i. Above the fixed cover 22j, an elevation cup 221 is provided.

The elevation cup 221 is connected to an elevation rod 22m that is inserted in the partition wall 22d to pass therethrough and that can be moved up and down. The elevation rod 22m is connected to a cup elevating device 18. The elevation rod 22m is elevated by the cup elevating device 18, and the elevation cup 221 is elevated according to the elevation of the elevation rod 22m. The cup elevating device 18 is connected to the control unit 60 and its operation is controlled by the control unit 60.

At an upper end of the elevation cup 221, an inclined wall 22p, inclined toward an inner upper area up to the collection opening 22b of the collection cup 22a, is provided. The inclined wall 22p is extended in parallel to an inclined wall of the collection space 22c up to the collection opening 22b of the collection cup 22a to be close to the inclined wall of the collection space 22c of the collection cup 22a.

If the elevation cup 221 is moved downwards by the cup elevating device 18, there is formed a flow path from the collection opening 22b to the discharge opening 22g of the first collection part 22e between the inclined wall of the collection cup 22a and the inclined wall 22p of the elevation cup 221 within the collection space 22c (see FIG. 12A).

If the elevation cup 221 is moved upwards by the cup elevating device 18, there is formed a flow path from the collection opening 22b to the discharge opening 22h at an inner space from the inclined wall 22p of the elevation cup 221 within the collection space 22c (see FIG. 12B).

Further, during a substrate process, the substrate processing apparatus 1 elevates the elevation cup 221 of the processing liquid collecting device 22 depending on a kind of the processing liquids and discharges the processing liquid through one of the discharge openings 22g and 22h.

By way of example, FIG. 12A illustrates an operation example of the substrate processing apparatus 1 when the substrate W is processed by discharging the SPM as an acid processing liquid to the substrate W through the first nozzle 312. In the substrate processing apparatus 1, while controlling the rotation driving device 11 to rotate the table 21b of the substrate holding unit 20 at a preset rotational speed, the control unit 60 opens the valve 314. Thus, the SPM supplied from the SPM supply source 91 is discharged to an upper surface of the substrate W through the first nozzle 312.

Here, in the substrate processing apparatus 1, the control unit 60 controls the cup elevating device 18 to move the elevation cup 221 downwards. As a result, there is formed a flow path from the collection opening 22b to the discharge opening 22g of the first collection part 22e.

Thus, the SPM supplied to the substrate W is scattered toward the outside of the outer periphery of the substrate W by a centrifugal force caused by the rotation of the substrate W. Then, the SPM and an atmosphere around the substrate W are collected by a suction force of the suction device 15 from the collection opening 22b of the collection cup 22a to the first collection part 22e of the collection space 22c.

Further, FIG. 12B illustrates an operation example of the substrate processing apparatus 1 when the substrate W is processed by discharging the SC1 as an alkaline processing liquid to the substrate W through the second nozzle 317. In the substrate processing apparatus 1, while controlling the rotation driving device 11 to rotate the table 21b of the substrate holding unit 20 at a preset rotational speed, the control unit 60 opens the valve 318. Thus, the SC1 supplied from the SC1 supply source 94 is discharged to the upper surface of the substrate W through the second nozzle 317.

Here, the substrate processing apparatus 1 controls the cup elevating device 18 to move the elevation cup 221 upwards. As a result, there is formed a flow path from the collection opening 22b to the discharge opening 22h.

Thus, the SC1 supplied to the substrate W is scattered toward the outside of the outer periphery of the substrate W by a centrifugal force caused by the rotation of the substrate W. Then, the SC1 and an atmosphere around the substrate W are collected by a suction force of the suction device 15 from the collection opening 22b of the collection cup 22a to the second collection part 22f of the collection space 22c.

The substrate processing apparatus is configured as described above. The substrate process and the nozzle cleaning process are performed according to a substrate processing program stored in a storage medium (not illustrated) readable by the control unit 60. Further, if the storage medium can store various programs such as the substrate processing program, it may be a semiconductor memory type storage medium, such as a ROM or a RAM, or a disk type storage medium, such as a hard disk or a CD-ROM.

<Timing for Performing Nozzle Cleaning Process>

Figure 13:
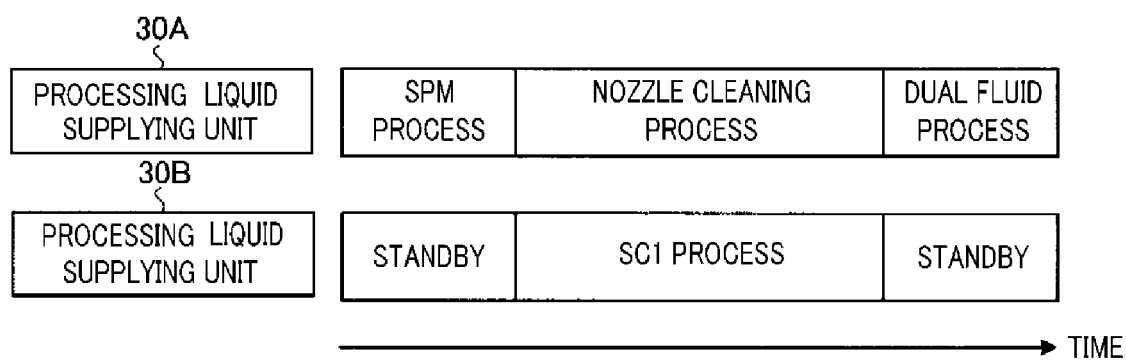
FIG. 13 shows a timing for performing a substrate process and a nozzle cleaning process.

Hereinafter, a timing for performing a substrate process and a nozzle cleaning process will be explained. FIG. 13 shows a timing for performing a substrate process and a nozzle cleaning process.

In the substrate processing apparatus 1, the substrate W loaded into the substrate processing apparatus 1 is held by the rotation holding device 21 (see FIG. 1) and rotated at a preset rotational speed. Then, as depicted in FIG. 13, in the substrate processing apparatus 1, the discharging device 31A of the processing liquid supplying unit 30A is located at the supply position above the central portion of the substrate W and a SPM process is performed by using the discharging device 31A. The SPM process is a substrate process using the SPM discharged through the first nozzle 312 of the discharging device 31A. During the SPM process, in the substrate processing apparatus 1, the processing liquid supplying unit 30B stands by at the nozzle standby unit 40B.

During the SPM process, the substrate processing apparatus 1 performs the pre-process explained with reference to FIG. 10A, so that the HDIW having a lowered temperature and remaining within the line is discharged and the storage tank 51 is warmed up. Thus, it is possible to perform the immersing and cleaning process to be performed later at an appropriate temperature.

Although the pre-process is performed during the SPM process herein, the pre-process may be performed at any time between a time when a series of the substrate processes are started and a time when the immersing and cleaning process is started. By way of example, the pre-process may be performed while or after the substrate W is loaded into the substrate processing apparatus 1 or may be performed after the SPM process is ended.

After the SPM process is ended, the substrate processing apparatus 1 moves the discharging device 31A from the supply position to the nozzle cleaning device 50. Further, the substrate processing apparatus 1 also moves the discharging device 31B of the processing liquid supplying unit 30B from the nozzle standby unit 40B to the supply position. Then, the substrate processing apparatus 1 performs a SC1 process by using the discharging device 31B. The SC1 process is a substrate process using the SC1 discharged through the second nozzle 317 of the discharging device 31B.

During the SC1 process, the substrate processing apparatus 1 performs the nozzle cleaning process to clean the first nozzle 312 and the third nozzle 313 of the discharging device 31A moved to the nozzle cleaning device 50.

As described above, the substrate processing apparatus 1 performs the nozzle cleaning process onto the first nozzle 312 and the third nozzle 313 during the substrate process (SC1 process) performed by using the second nozzle 317. Thus, the substrate processing apparatus 1 can clean the first nozzle 312 and the third nozzle 313 without stopping the series of the substrate processes.

Further, when the cleaning process onto the first nozzle 312 and the third nozzle 313 during the substrate process is ended, the substrate processing apparatus 1 moves the processing liquid supplying unit 30A to the nozzle standby unit 40A to stand by at the nozzle standby unit 40A.

After the SC1 process is ended, the substrate processing apparatus 1 moves the discharging device 31B from the supply position to the nozzle standby unit 40B. Further, the substrate processing apparatus 1 also moves the discharging device 31A, which has been cleaned in the cleaning process, to the supply position again. Then, the substrate processing apparatus 1 performs a dual fluid process by using the discharging device 31A. The dual fluid process is a substrate process using the processing liquid in a misty state discharged through the third nozzle 313 of the discharging device 31A.

After the dual fluid process is ended, the substrate processing apparatus 1 moves the discharging device 31A to the nozzle standby unit 40A. Then, the substrate processing apparatus 1 increases the rotational speed of the substrate W to perform a spin drying process onto the substrate W. Thereafter, the substrate processing apparatus 1 stops the rotation of the substrate W and ends the series of the substrate processes.

As described above, the nozzle cleaning device 50 in accordance with the first illustrative embodiment includes the storage tank 51, the liquid discharging portion 52, and the overflow discharging portion 54. The storage tank 51 has the cylindrical inner peripheral surface 61 and stores the cleaning liquid for cleaning the nozzle (the first nozzle 312 or the third nozzle 313) used for the substrate process. The liquid discharging portion 52 discharges the cleaning liquid into the storage tank 51 toward a position eccentric with respect to the central axis of the inner peripheral surface 61 of the storage tank 51. Thus, the cleaning liquid is stored within the storage tank 51 and a vortex flow revolving within the storage tank 51 is formed. The overflow discharging portion 54 discharges the cleaning liquid flowing over the storage tank 51. Therefore, the substrate processing apparatus 1 in accordance with the first illustrative embodiment uniformly cleans the nozzle from the front end of the nozzle to the upper part thereof.

Further, the substrate processing apparatus 1 in accordance with the first illustrative embodiment includes the first nozzle 312; the second nozzle 317 used for the substrate process performed after the substrate process performed by using the first nozzle 312; and the third nozzle 313 used for the substrate process performed after the substrate process performed by using the second nozzle 317. The first nozzle 312 and the third nozzle 313 are provided at the arm 32A (corresponding to a first arm) and the second nozzle 317 is provided at the arm 32B (corresponding to a second arm).

The substrate processing apparatus 1 performs the nozzle cleaning process onto the first nozzle 312 and the third nozzle 313 during the substrate process (SC1 process) performed by using the second nozzle 317. Therefore, it is possible to clean the first nozzle 312 and the third nozzle 313 without stopping the series of the substrate processes.

Furthermore, in accordance with the first illustrative embodiment, there has been explained the example where the first nozzle 312 and the third nozzle 313 are cleaned at the same time. However, the substrate processing apparatus 1 may clean one of the first nozzle 312 and the third nozzle 313.

Moreover, in accordance with the first illustrative embodiment, there has been explained the example where the first nozzle 312 and the third nozzle 313 are provided at the arm 32A and the second nozzle 317 is provided at the arm 32B in the substrate processing apparatus 1. However, the present disclosure is not limited thereto. In the substrate processing apparatus 1, each of the nozzles used for the former and latter substrate processes may be provided at each of the arms. Accordingly, during the substrate process performed by using the nozzle provided at one of the arms, the nozzle cleaning process may be performed onto the nozzle provided at the other arms. As a result, it is possible to clean the nozzle while preventing a time period required for the substrate process from being increased.

In accordance with the first illustrative embodiment, there has been explained the example where the third nozzle 313 is used as an external mixed-type dual fluid nozzle. However, the third nozzle 313 may be used as an internal mixed-type dual fluid nozzle. The internal mixed-type dual fluid nozzle mixes a liquid and a gas within the nozzle, and then, discharges a mixed processing liquid in a misty state through a discharge opening.

Second Illustrative Embodiment

However, during a nozzle cleaning process, a substrate process is performed outside the nozzle cleaning device 50. For this reason, it is desirable that a gas injected from the gas injecting portion 53 of the nozzle cleaning device is not leaked to the outside of the nozzle cleaning device 50. Therefore, a nozzle cleaning device may include an air intake unit configured to suction therein a gas injected from a gas injecting portion. Hereinafter, an example of a nozzle cleaning device including the air intake unit will be explained with reference to FIG. 14.

Figure 14:
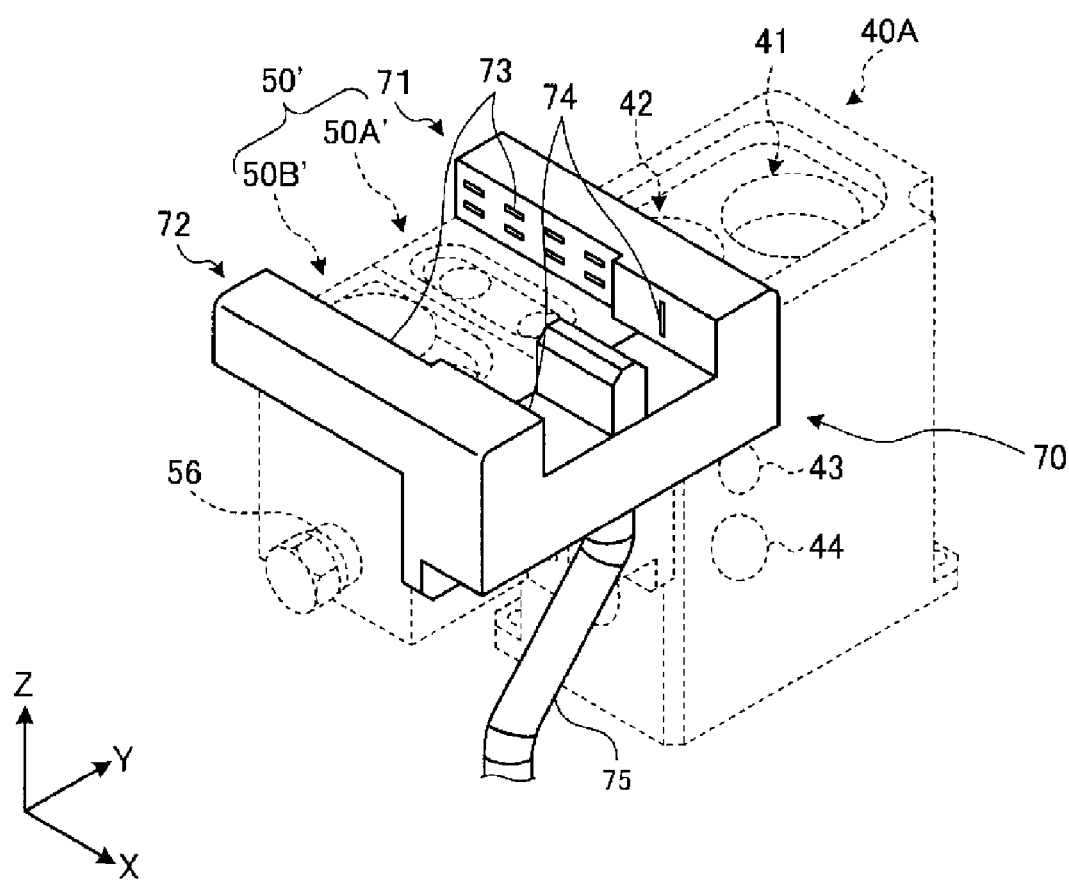
FIG. 14 is a schematic perspective view of a configuration of a nozzle cleaning device in accordance with a second illustrative embodiment.

FIG. 14 is a schematic perspective view of a configuration of a nozzle cleaning device in accordance with a second illustrative embodiment. Hereinafter, the same components as the above-described components will be assign the same reference numerals and redundant explanation thereof will be omitted.

By way of example, as depicted in FIG. 14, a nozzle cleaning device 50' may include a detachably attached air intake unit 70 above the storage tank 51.

The air intake unit 70 includes a first air intake unit 71 and a second air intake unit 72. The first air intake unit 71 is positioned near a first cleaning unit 50A' and configured to mainly suction therein a gas injected from a gas injecting portion of the first cleaning unit 50A'. Further, the second air intake unit 72 is positioned near a second cleaning unit 50B' and configured to mainly suction therein a gas injected from a gas injecting portion of the second cleaning unit 50B'.

Each of the first air intake unit 71 and the second air intake unit 72 includes multiple air intake openings 73. Further, the air intake unit 70 includes air intake openings 74 near a position where the arm 32A (see FIG. 2) is located during a nozzle cleaning process. The air intake openings 73 and 74 communicate with each other within the air intake unit 70, and are connected to a non-illustrated air intake device via a line 75. The non-illustrated air intake device is controlled by the control unit 60.

The air intake unit 70 suctions a gas through the air intake openings 73 and 74 by an air intake force of the non-illustrated air intake device. The amount of a gas taken by the air intake unit 70 is set to be greater than the amount of a gas injected from a gas injecting portion of the nozzle cleaning device 50'. With this air intake unit 70, the nozzle cleaning device 50' can prevent the gas injected from the gas injecting portion from being leaked to the outside of the nozzle cleaning device 50'.

As described above, the nozzle cleaning device 50' may be provided above the storage tank and may include the air intake unit configured to suction therein a gas whose amount is equal to or greater than the amount of a gas injected from the gas injecting portion.

Further, the nozzle cleaning device 50' includes a supplementary air intake unit 56. In the nozzle cleaning device 50', by way of example, if the amount of the gas suctioned by the air intake unit 70 is not sufficient, the supplementary air intake unit 56 may be connected to the air intake device to perform an air intake process through the supplementary air intake unit 56.

To be specific, the supplementary air intake unit 56 is connected to a liquid collecting portion of the first cleaning unit 50A' and a liquid collecting portion (see reference numeral 55 in FIG. 5) of the second cleaning unit 50B'. By performing the air intake process through the supplementary air intake unit 56, the gas injected to the inside of the storage tank from the gas injecting portion may pass through a discharge opening and the liquid collecting portion, and then, may be suctioned to the outside from the supplementary air intake unit 56.

The supplementary air intake unit 56 suctions therein the gas injected from the gas injecting portion through the discharge opening for discharging the cleaning liquid. That is, the discharge opening for discharging the cleaning liquid also serves as a suction opening for suctioning a gas. Accordingly, there is no need to provide a suction opening for suctioning a gas in the storage tank.

Further, the nozzle cleaning device 50' may perform the air intake process by using only the supplementary air intake unit 56. In this case, the supplementary air intake unit 56 suctions in a gas in an amount equal to or greater than the amount of the gas injected from the gas injecting portion.

Third Illustrative Embodiment

However, a configuration of the storage tank is not limited to the example described in the first illustrative embodiment.

Figure 15A:
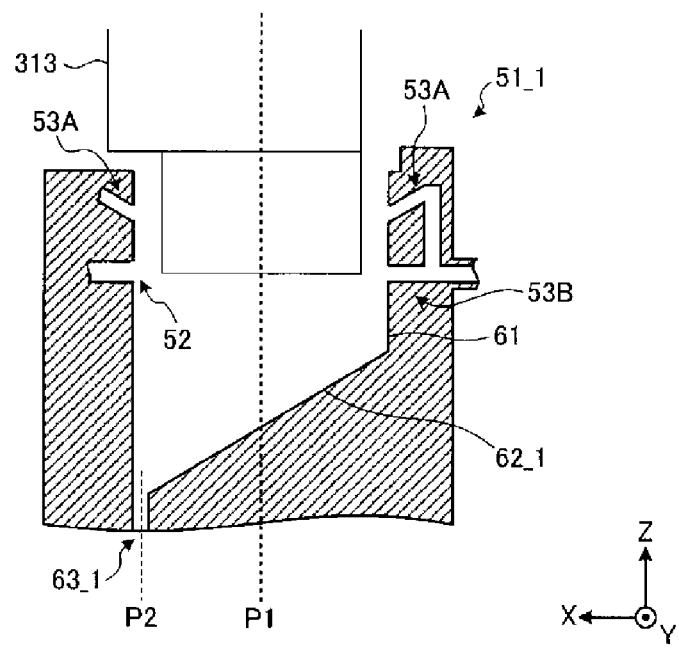
FIG. 15A is a schematic side cross sectional view of a configuration of a storage tank in accordance with a third illustrative embodiment.

Hereinafter, another configuration example of the storage tank will be explained with reference to FIGS. 15A and 15B. FIG. 15A is a schematic side cross sectional view of a configuration of a storage tank in accordance with a third illustrative embodiment and FIG. 15B is a schematic side cross sectional view of a first modification example of the storage tank in accordance with the third illustrative embodiment.

By way of example, as depicted in FIG. 15A, in a storage tank 51_1, a vertex of a funnel-shaped bottom surface 62_1 may be located at a position P2 eccentric with respect to a central axis P1 of the inner peripheral surface 61. That is, a cleaning liquid discharge opening 63_1 may be located at the position P2 eccentric with respect to the central axis P1 of the inner peripheral surface 61.

Since the discharge opening 63_1 is located eccentrically with respect to the central axis P1 of the inner peripheral surface 61, a central position of a vortex formed when a cleaning liquid is discharged through the discharge opening 63_1 becomes eccentric with respect to the central axis P1 of the inner peripheral surface 61 of the storage tank 51_1. Thus, it is possible to prevent a dead air space from being formed at the front end surface of the third nozzle 313 and also possible to suppress non-uniformity in cleaning of the front end surface of the third nozzle 313.

Figure 15B:
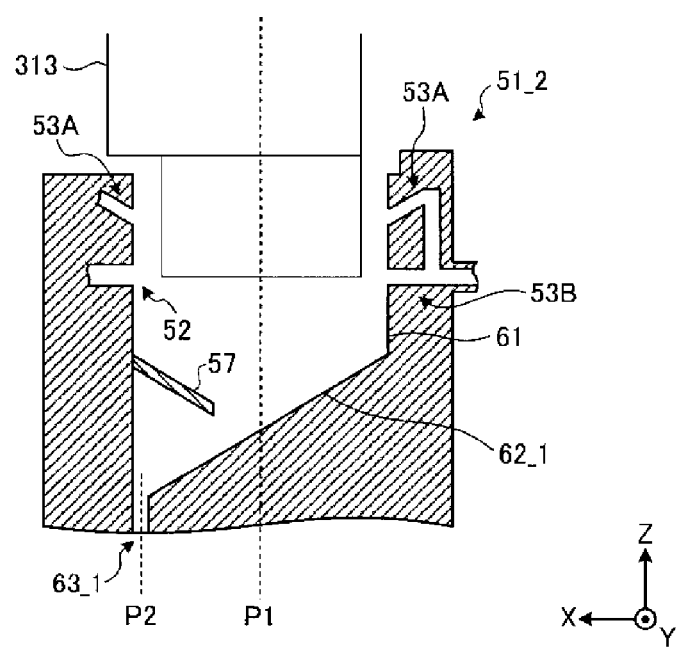
FIG. 15B is a schematic side cross sectional view of another configuration (a first modification example) of the storage tank in accordance with the third illustrative embodiment.

Further, as depicted in FIG. 15B, in a storage tank 51_2, a partition member 57 extending toward the central axis P1 of the inner peripheral surface 61 in a downwardly inclined direction may be provided above the discharge opening 63_1 located eccentrically with respect to the central axis P1 of the inner peripheral surface 61. Thus, it is possible to easily form a vortex flow of the cleaning liquid while preventing a dead air space from being formed at the front end surface of the third nozzle 313.

Further, in the first illustrative embodiment, although the cylindrical inner peripheral surface 61 of the storage tank 51 is formed in a circle shape (see FIG. 6) when viewed from the top, a shape of the cylindrical inner peripheral surface of the storage tank 51 when viewed from the top is not limited to the circle shape and may be, for example, an elliptical shape horizontally extended in a certain direction. Details thereof will be explained with reference to FIGS. 16A to 16C.

Figure 16A:
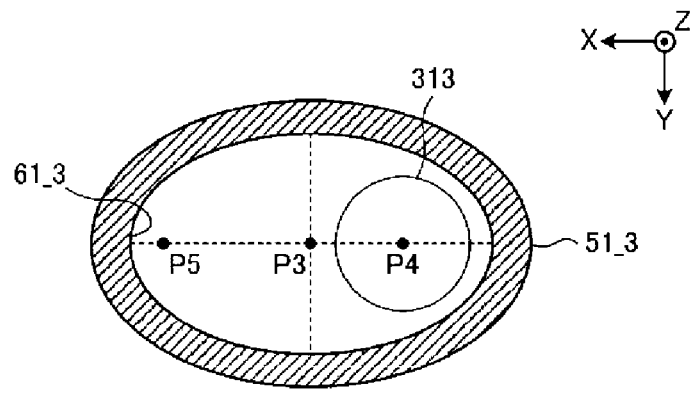
FIG. 16A is a schematic plane cross sectional view of still another configuration (a second modification example) of the storage tank in accordance with the third illustrative embodiment.
Figure 16B:
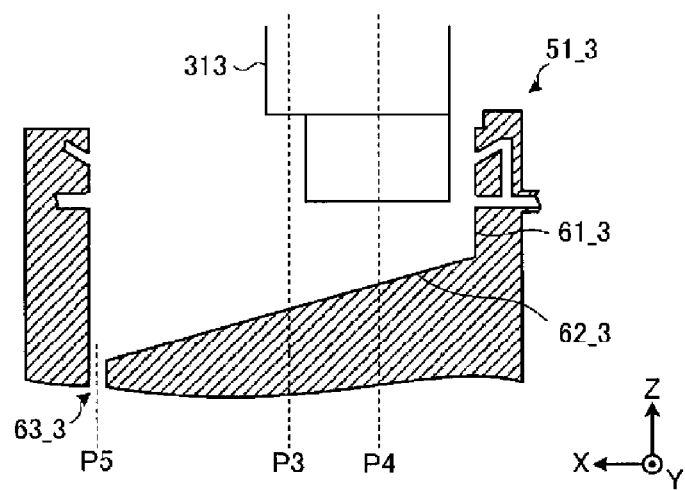
FIG. 16B is a schematic side cross sectional view of the storage tank depicted in FIG. 16A.
Figure 16C:
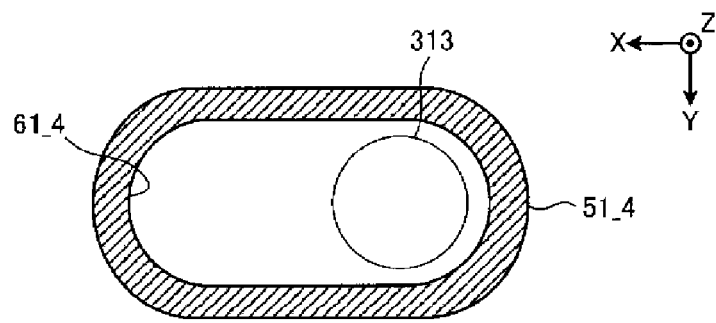
FIG. 16C is a schematic plane cross sectional view of still another configuration (a third modification example) of the storage tank in accordance with the third illustrative embodiment.

FIG. 16A is a schematic plane cross sectional view of a second modification example of the storage tank in accordance with the third illustrative embodiment, FIG. 16B is a schematic side cross sectional view of the storage tank depicted in FIG. 16A. FIG. 16C is a schematic plane cross sectional view of a third modification example of the storage tank in accordance with the third illustrative embodiment.

As depicted in FIG. 16A, an inner peripheral surface 61_3 of a storage tank 51_3 has a substantially elliptic shape when viewed from the top. The third nozzle 313 is inserted into the storage tank 51_3 while being close to a side of the storage tank 51_3.

Thus, as depicted in FIGS. 16A and 16B, a central axis P3 of the inner peripheral surface 61_3 of the storage tank 51_3 may be deviated from a central axis P4 of the third nozzle 313. That is, since the third nozzle 313 may be located eccentrically with respect to a central position of a vortex flow formed within the storage tank 51_3, it is possible to prevent a dead air space from being formed at the front end surface of the third nozzle 313.

Further, a cleaning liquid discharge opening 63_3 is located at a position P5 opposite to the side of the third nozzle 313. Since a central position of a vortex flow formed when a cleaning liquid is discharged through the discharge opening 63_3 can be located eccentrically with respect to the central axis of the third nozzle 313, it is possible to prevent a dead air space from being formed at the front end surface of the third nozzle 313 more effectively.

Herein, there has been explained the example where the inner peripheral surface 61_3 of the storage tank 51_3 has a substantially elliptical shape. However, the inner peripheral surface of the storage tank may have a substantially rectangular shape of which short sides are protruded in a circular arc shape as depicted in FIG. 16C.

In the above-described illustrative embodiments, there has been explained the example where a gas injecting portion has a two-stage configuration including an upper injecting portion and a lower injecting portion. However, the gas injecting portion may be a one-stage configuration or may include discharging units in three or more stages.

Further, in the above-described illustrative embodiments, there has been explained the example where a substrate processing apparatus includes a nozzle cleaning device configured to clean a first nozzle and a third nozzle. However, the substrate processing apparatus may further include a nozzle cleaning device configured to clean a second nozzle. In this case, the nozzle cleaning device for cleaning the second nozzle may be provided to be close to a nozzle standby unit of the second nozzle.

Furthermore, in the above-described illustrative embodiments, a gas injecting portion injects a gas during the pre-process or the nozzle cleaning process, so that it is possible to prevent a cleaning liquid stored in the storage tank from being introduced into the flow path of the gas injecting portion. However, if the cleaning liquid is not introduced into the flow path of the gas injecting portion, the gas injecting portion does not need to inject the gas. By way of example, by setting a diameter of the gas injecting portion to be small enough not to introduce the cleaning liquid, the introduction of the cleaning liquid into the flow path of the gas injecting portion does not occur.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner. The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:
1. A nozzle cleaning device comprising:
    a storage tank, having a cylindrical inner peripheral surface and an outer wall of a first height, said storage tank being configured to store a cleaning liquid and immerse a nozzle therein;
    a liquid discharging portion configured to discharge the cleaning liquid into the storage tank toward a position eccentric with respect to a central axis of the cylindrical inner peripheral surface within the storage tank and configured to discharge the cleaning liquid tangentially into contact with the cylindrical inner peripheral sur- face to form a vortex flow of the cleaning liquid revolving within the storage tank;
a cleaning liquid supply source connected to the liquid discharging portion and configured to supply the cleaning liquid to the liquid discharging portion;
an overflow discharging portion separated from the storage tank by a barrier of a second height, said second height being lower than said first height, said overflow discharge portion being configured to discharge the cleaning liquid that overflows out of the storage tank from a top surface of the storage tank over said barrier;
a gas supply source; and
a gas injecting portion configured to inject a gas, comprising:
at least one first injecting portion that is located at a vertical position higher than the liquid discharging portion and is configured to inject the gas in a downwardly inclined direction; and
at least one second injecting portion that is located at a vertical position equal to the liquid discharging portion and is configured to inject the gas in a horizontal direction,
wherein an upstream side of the at least one second injecting portion is in fluid communication with only the gas supply source from among the gas supply source and the cleaning liquid supply source,
wherein the storage tank has a funnel-shaped bottom surface directly connected to the cylindrical inner peripheral surface, and
a vertex of the funnel-shaped bottom surface is located at a position eccentric with respect to the central axis of the cylindrical inner peripheral surface, and a discharge opening through which the cleaning liquid is discharged is arranged at the vertex.

2. The nozzle cleaning device of claim 1,
wherein the at least one first injecting portion and the at least one second injecting portion are plural in number.

3. The nozzle cleaning device of claim 2,
wherein, in the first injecting portions, one-side first injecting portions whose injection openings are arranged at one side of the nozzle and another-side first injecting portions whose injection openings are arranged at another side of the nozzle are configured to inject the gas in parallel to each other while the gas injected from the one-side first injecting portions and the gas injected from the another-side first injecting portions do not collide with each other, when viewed from the top.

4. The nozzle cleaning device of claim 1, further comprising:
an air intake unit provided above the storage tank and configured to suction therein the gas in an amount equal to or greater than that of the gas injected from the gas injecting portion.

5. The nozzle cleaning device of claim 1,
wherein the cleaning liquid includes a deionized water heated at a predetermined temperature.

6. A substrate processing apparatus comprising:
a nozzle configured to discharge a fluid toward a substrate;
an arm configured to support and move the nozzle; and
the nozzle cleaning device of claim 1.

7. The substrate processing apparatus of claim 6, further comprising:
a flow rate controller configured to control a flow rate of the gas injected from the gas injecting portion; and
a control unit configured to control the flow rate controller,
wherein the control unit controls the flow rate controller to allow the gas injecting portion to inject the gas at a different flow rate between when performing a cleaning process of the nozzle and when performing a drying process of the nozzle.

8. The substrate processing apparatus of claim 6, further comprising:
a nozzle standby unit, having an accommodating portion that accommodates therein the nozzle, configured to allow the nozzle to standby while accommodating the nozzle in the accommodating portion, the nozzle standby unit being disposed to be adjacent to the nozzle cleaning device.

9. The nozzle cleaning device of claim 1,
wherein the overflow discharging portion includes a vertical flow path extended in a vertical direction within the nozzle cleaning device, and
the cleaning liquid that has been overflowed from the top surface of the storage tank is discharged to outside of the nozzle cleaning device via the vertical flow path.

10. The nozzle cleaning device of claim 9, further comprising:
a liquid collecting portion provided below the vertical flow path and configured to collect the cleaning liquid introduced from a discharge opening provided at a bottom of the storage tank and the cleaning liquid introduced from the vertical flow path.

* * * * *

UNITED STATES PATENT AND TRADEMARK OFFICE
CERTIFICATE OF CORRECTION

PATENT NO. : 10,700,166 B2
APPLICATION NO. : 13/904315
DATED : June 30, 2020
INVENTOR(S) : Yoshihiro Kai et al.

It is certified that error appears in the above-identified patent and that said Letters Patent is hereby corrected as shown below:

On the Title Page

Item (30), Foreign Application Priority Data, "2012-125173" should be -- 2012-125273 --.

In the Specification

Column 4, Line 45, "processing apparatus includes" should be -- processing apparatus 1 includes --.

In the Claims

Column 24, Line 8, Claim 5, "includes a deionized water" should be -- includes deionized water --.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*